(12) United States Patent
Reed et al.

(10) Patent No.: US 12,237,147 B2
(45) Date of Patent: Feb. 25, 2025

(54) METHODS AND SYSTEMS FOR EVENT MODULATED ELECTRON MICROSCOPY

(71) Applicants: Integrated Dynamic Electron Solutions, Inc., Pleasanton, CA (US); The Provost, Fellows, Foundation Scholars, and the other members of Board, of the College of the Holy and Undivided Trinity of Queen Elizabeth near Dublin, Dublin (IE)

(72) Inventors: Bryan Walter Reed, San Leandro, CA (US); Lewys Jones, Dublin (IE)

(73) Assignees: INTEGRATED DYNAMIC ELECTRON SOLUTIONS, INC., Pleasanton, CA (US); THE PROVOST, FELLOWS, FOUNDATION SCHOLARS, AND THE OTHER MEMBERS OF BOARD, OF THE COLLEGE OF THE HOLY AND UNDIVIDED TRINITY OF QUEEN ELIZABETH NEAR DUBLIN, Dublin (IE)

( * ) Notice: Subject to any disclaimer, the term of this patent is extended or adjusted under 35 U.S.C. 154(b) by 0 days.

(21) Appl. No.: 18/383,422

(22) Filed: Oct. 24, 2023

(65) Prior Publication Data

US 2024/0355581 A1    Oct. 24, 2024

Related U.S. Application Data

(63) Continuation of application No. 18/104,101, filed on Jan. 31, 2023, now Pat. No. 11,848,173.

(51) Int. Cl.
*H01J 37/28* (2006.01)
*H01J 37/147* (2006.01)
(Continued)

(52) U.S. Cl.
CPC .......... *H01J 37/28* (2013.01); *H01J 37/1477* (2013.01); *H01J 37/222* (2013.01); *H01J 37/244* (2013.01);
(Continued)

(58) Field of Classification Search
CPC ...... H01J 37/28; H01J 37/1477; H01J 37/222; H01J 37/244; H01J 2237/24495; H01J 2237/24535; H01J 2237/2802
See application file for complete search history.

(56) References Cited

U.S. PATENT DOCUMENTS

| 4,189,641 | A | 2/1980 | Katagiri et al. |
| 4,420,686 | A | 12/1983 | Onoguchi et al. |

(Continued)

FOREIGN PATENT DOCUMENTS

| WO | WO-2014100835 A1 | 6/2014 |
| WO | WO-2017087045 A1 | 5/2017 |

(Continued)

OTHER PUBLICATIONS

Auad et al. Event-based hyperspectral EELS: towards nanosecond temporal resolution. Microsc. Microanal. 28 (Suppl 1), pp. 2648-2649 (2022). Retrieved Feb. 10, 2023 at URL: https://scholar.archive.org/work/5ipzkkykuzffjn4ujikmcelkfi/access/wayback/https://www.cambridge.org/core/services/aop-cambridge-core/content/view/205AD43BA851BBE23B0724042D8CCEA8/S1431927622010030a.pdf/div-class-title-event-based-hyperspectral-eels-towards-nanosecond-temporal-resolution-div.pdf.

(Continued)

*Primary Examiner* — David A Vanore
(74) *Attorney, Agent, or Firm* — Wilson Sonsini Goodrich & Rosati

(57) ABSTRACT

A method for measuring an electron signal or an electron induced signal may be provided. The method may include
(Continued)

providing a threshold number of events or a threshold event rate for a pixel on a detector. The method may include collecting from the detector the threshold number of events or determining that the threshold event rate is achieved, wherein a signal at the detector is an electron signal or an electron induced signal from a sample. The method may include modulating an intensity of an electron source directed to the sample in response.

21 Claims, 12 Drawing Sheets

(51) Int. Cl.
*H01J 37/22* (2006.01)
*H01J 37/244* (2006.01)

(52) U.S. Cl.
CPC ........... *H01J 2237/24495* (2013.01); *H01J 2237/24535* (2013.01); *H01J 2237/2802* (2013.01)

(56) References Cited

U.S. PATENT DOCUMENTS

| | | | | |
|---|---|---|---|---|
| 5,191,213 A * | 3/1993 | Ahmed | ............... | G01R 31/305 250/397 |
| 5,825,034 A | 10/1998 | Tamura | | |
| 5,874,735 A | 2/1999 | Matsumoto et al. | | |
| 6,484,306 B1 * | 11/2002 | Bokor | ............... | G06T 7/0006 700/121 |
| 6,608,305 B1 * | 8/2003 | Kin | ............... | H01J 37/28 250/311 |
| 7,253,410 B1 | 8/2007 | Bertsche et al. | | |
| 7,925,284 B2 * | 4/2011 | Stubbs | ............... | H01J 37/304 455/556.1 |
| 8,933,401 B1 | 1/2015 | Reed | | |
| 9,069,081 B2 * | 6/2015 | Campbell | ............... | G01T 1/247 |
| 9,165,743 B2 | 10/2015 | Reed et al. | | |
| 9,841,592 B2 | 12/2017 | Reed | | |
| 10,213,176 B2 * | 2/2019 | Qi | ............... | A61B 6/5258 |
| 10,715,750 B2 * | 7/2020 | Berner | ............... | H04N 25/78 |
| 11,476,082 B1 | 10/2022 | Bloom et al. | | |
| 11,728,128 B2 | 8/2023 | Bloom et al. | | |
| 11,804,359 B2 | 10/2023 | Bloom et al. | | |
| 11,848,173 B1 | 12/2023 | Reed et al. | | |
| 2002/0066863 A1 * | 6/2002 | Chao | ............... | H01J 37/304 250/397 |
| 2004/0000642 A1 * | 1/2004 | Veneklasen | ............... | H01J 37/26 250/311 |
| 2004/0066878 A1 | 4/2004 | Seppi | | |
| 2005/0133733 A1 | 6/2005 | Nakasuji et al. | | |
| 2005/0211921 A1 | 9/2005 | Wieland et al. | | |
| 2006/0022137 A1 | 2/2006 | Ohkura | | |
| 2006/0102853 A1 * | 5/2006 | Heinitz | ............... | G01N 23/04 250/491.1 |
| 2008/0230697 A1 * | 9/2008 | Tanimoto | ............... | H01J 37/28 250/310 |
| 2009/0289191 A1 * | 11/2009 | Frosien | ............... | H01J 37/304 250/424 |
| 2010/0025579 A1 | 2/2010 | Bilhorn | | |
| 2010/0163727 A1 * | 7/2010 | Bell | ............... | H01J 37/265 250/307 |
| 2011/0036988 A1 * | 2/2011 | Campbell | ............... | G01T 1/247 250/370.07 |
| 2011/0133091 A1 * | 6/2011 | Frach | ............... | G01T 1/1642 250/208.3 |
| 2011/0139985 A1 * | 6/2011 | Tanimoto | ............... | G01N 23/225 250/310 |
| 2011/0147599 A1 * | 6/2011 | Grobshtein | ............... | G01T 1/249 250/371 |
| 2012/0091339 A1 * | 4/2012 | Ominami | ............... | H01J 37/28 250/311 |
| 2014/0097342 A1 * | 4/2014 | Tsuno | ............... | G01B 15/04 250/307 |
| 2014/0346349 A1 * | 11/2014 | Nishimura | ............... | H01J 37/3177 250/311 |
| 2015/0063671 A1 * | 3/2015 | Shahar | ............... | G01T 1/1647 382/132 |
| 2015/0177392 A1 * | 6/2015 | Hefetz | ............... | G01T 1/1648 250/362 |
| 2015/0332888 A1 | 11/2015 | Reed et al. | | |
| 2015/0377958 A1 * | 12/2015 | Ukraintsev | ............... | G01Q 30/02 324/750.18 |
| 2016/0189922 A1 | 6/2016 | Kooijman et al. | | |
| 2017/0025247 A1 | 1/2017 | Stevens et al. | | |
| 2017/0323763 A1 * | 11/2017 | Itai | ............... | H01J 37/147 |
| 2018/0269026 A1 * | 9/2018 | Hoque | ............... | H01J 37/265 |
| 2018/0374674 A1 * | 12/2018 | Itai | ............... | H01J 37/147 |
| 2019/0287760 A1 | 9/2019 | He et al. | | |
| 2020/0176219 A1 | 6/2020 | Shaked et al. | | |
| 2021/0043419 A1 | 2/2021 | Nakamura et al. | | |
| 2021/0082661 A1 | 3/2021 | Bloom et al. | | |
| 2022/0336185 A1 | 10/2022 | Bloom et al. | | |
| 2022/0406561 A1 | 12/2022 | Bloom et al. | | |
| 2023/0020957 A1 | 1/2023 | Buijsse et al. | | |
| 2023/0411112 A1 | 12/2023 | Bloom et al. | | |

FOREIGN PATENT DOCUMENTS

| | | | |
|---|---|---|---|
| WO | WO-2020178813 | A1 | 9/2020 |
| WO | WO-2021007360 | A1 | 1/2021 |
| WO | WO-2021224622 | A1 | 11/2021 |
| WO | WO-2022220918 | A1 | 10/2022 |
| WO | WO-2024163516 | A2 | 8/2024 |

OTHER PUBLICATIONS

Béché et al. Development of a fast electromagnetic beam blanker for compressed sensing in scanning transmission electron microscopy. Appl. Phys. Lett. 108, 093103 (2016). 5 pages.

Bücker et al. Electron beam dynamics in an ultrafast transmission electron microscope with Wehnelt electrode. Ultramicroscopy, vol. 171, pp. 8-18 (2016). Available online Aug. 20, 2016.

Béché et al. Development of a fast electromagnetic shutter for compressive sensing imaging in scanning transmission electron microscopy. arXiv:1509.06656 (2015). Retrieved Mar. 11, 2022 at URL: https://arxiv.org/pdf/1509.06656. 7 pages.

Beck et al. Fast Gradient-Based Algorithms for Constrained Total Variation Image Denoising and Deblurring Problems. IEEE Transactions on Image Processing, vol. 18, No. 11, pp. 2419-2434, Nov. 2009.

Berkels et al. Optimized imaging using non-rigid registration. Ultramicroscopy, vol. 138, pp. 46-56 (Mar. 2014). Retrieved Feb. 10, 2023 at URL: https://arxiv.org/pdf/1403.6774.

Browning et al. Implementing Sub-sampling Methods for Low-Dose (Scanning) Transmission Electron Microscopy (S/TEM). Microsc. Microanal. 23 (Suppl 1), pp. 82-83 (2017).

Candes et al. An Introduction To Compressive Sampling. IEEE Signal Processing Magazine, pp. 21-30 (Mar. 2008).

Candes, et al. Robust uncertainty principles: Exact signal reconstruction from highly incomplete frequency information. IEEE Transactions on information theory. 2006; 52(2):489-509.

Choe et al. Mitigation of radiation damage in biological macromolecules via tunable picosecond pulsed transmission electron microscopy. Preprint. bioRxiv. Version posted Aug. 4, 2020. Retrieved Mar. 11, 2022 at URL: https://www.biorxiv.org/content/10.1101/2020.05.15.099036v2.full.pdf . 25 pages.

Crozier. Vibrational and valence aloof beam EELS: A potential tool for nondestructive characterization of nanoparticle surfaces. Ultramicroscopy, vol. 180, pp. 104-114 (Sep. 2017). Retrieved Feb. 10, 2023 at URL: https://www.sciencedirect.com/science/article/am/pii/S0304399117301080.

Dekkers et al. Differential Phase Contract in a STEM. OPTIK, vol. 41, No. 4, pp. 452-456 (1974).

DigitalMicrograph Software. Web page. Gatan, Inc. 2022. Retrieved Mar. 14, 2022 at URL: https://www.gatan.com/products/tem-analysis/gatan-microscopy-suite-software . 5 pages.

(56) References Cited

OTHER PUBLICATIONS

Duarte et al. Multiscale Random Projections for Compressive Classification. 2007 IEEE International Conference on Image Processing, 2007, pp. VI-161-VI-164.

Duarte, et al. Single-pixel imaging via compressive sampling. IEEE Signal Processing Magazine. 2008; 25(2):83-91.

E et al. Probe integrated scattering cross sections in the analysis of atomic resolution HAADF STEM images. Ultramicroscopy 133 (2013) 109-119. Available online Jul. 15, 2013.

Electrostatic Dose Modulator. Brochure. JEOL / IDES. May 7, 2020. 2 pages.

Harmany et al. This is SPIRAL-TAP: Sparse Poisson Intensity Reconstruction ALgorithms—Theory and Practice. IEEE Transactions on Image Processing, vol. 21, No. 3, pp. 1084-1096 (Mar. 2012). Downloaded Mar. 14, 2022 from: URL: https://arxiv.org/pdf/1005.4274.

Hedley et al. Fast Ptychographic Reconstruction for Sparse Binary Ptychography Data. Microsc. Microanal. 28 (Suppl 1), pp. 438-439 (2022). Retrieved Feb. 9, 2023 at URL: https://www.cambridge.org/core/services/aop-cambridge-core/content/view/E542D2827CB555495B0D2377FB62B196/S1431927622002446a.pdf/div-class-title-fast-ptychographic-reconstruction-for-sparse-binary-ptychography-data-div.pdf.

Helios 5 UX DualBeam. Data Sheet. Thermo Fisher Scientific. 2019. Retrieved Mar. 11, 2022 at URL: https://assets.thermofisher.com/TFS-Assets/MSD/Datasheets/Helios%205%20UX%20DualBeam%20Semiconductor%20Datasheet.pdf . 4 pages.

JEOL IDES EDM: Electrostatics Dose Modulator ( 2nd ver), Published to youtube Dec. 2, 2020. First version of video distributed to sales teams May 22, 2020. Screen captures retrieved Mar. 17, 2022 from the Internet: https://www.youtube.com/watch?v=JK5W6bNdk0M . 24 pages.

JEOL-IDES Products. Web Page. Went live May 27, 2020. Retrieved Mar. 11, 2022 at URL: https://www.jeol.co.jp/en/products/detail/JEOL-IDES_Products.html . 4 pages.

Ji et al. Influence of cathode geometry on electron dynamics in an ultrafast electron microscope. Struct. Dyn. 4, 054303 (2017). Published online Jul. 17, 2017. 18 pages.

Jones et al. Identifying and Correcting Scan Noise and Drift in the Scanning Transmission Electron Microscope. Microscopy and Microanalysis 19(4), 1050-1060 (2013). Retrieved Feb. 9, 2023 at URL: https://academic.oup.com/mam/article-pdf/19/4/1050/48228098/mam1050.pdf.

Jones et al. Smart Align—a new tool for robust non-rigid registration of scanning microscope data. Advanced Structural and Chemical Imaging (2015) 1:8. 16 pages.

Jones. Practical Aspects of Quantitative and High-Fidelity STEM Data Recording. In Bruma, ed. Scanning Transmission Electron Microscope, First Edition. First published 2020. CRC Press, Boca Raton, FL. 39 pages.

Kim et al. Quantitative measurement of strain field in strained-channel-transistor arrays by scanning moiré fringe imaging. Appl. Phys. Lett. 103, 033523 (2013). Published online Jul. 19, 2013. 3 pages.

Kovarik et al. Implementing an accurate and rapid sparse sampling approach for low-dose atomic resolution STEM imaging. Applied Physics Letters 109, 164102 (2016). Published online Oct. 21, 2016. 5 pages.

Kudryashov et al. Grey scale structures formation in SU-8 with e-beam and UV. Microelectronic Engineering, vol. 67-68, pp. 306-311 (2003).

Lagrange et al. Movie-mode dynamic electron microscopy. MRS Bulletin, vol. 40, pp. 22-28 (Jan. 2015).

Lebeau. Experimental quantification of annular dark-field images in scanning transmission electron microscopy. Ultramicroscopy 108 (2008) 1653-1658.

M & M 2017, Microscopy & Microanalysis, Onsite Program Guide & Exhibitor Information, Aug. 6-10, 2017, St. Louis, MO. Downloaded Mar. 14, 2022 at URL: https://www.microscopy.org/MandM/2017/program/OnsiteProgram2017_Web.pdf . 248 pages.

Midgley. Sparsity, Parsimony and Data Reduction—Applications across Multi-Dimensional Electron Microscopy. Microsc. Microanal. 23 (Suppl 1), pp. 112-113 (2017).

Moerland et al. Time-resolved cathodoluminescence microscopy with sub-nanosecond beam blanking for direct evaluation of the local density of states. Opt. Express 24, 24760-24772 (2016).

Mullarkey et al. Development of a Practicable Digital Pulse Read-Out for Dark-Field STEM. Microscopy and Microanalysis 27, 99-108 (2021).

Mullarkey et al. Using Your Beam Efficiently: Reducing Electron Dose in the STEM via Flyback Compensation. Microscopy and Microanalysis (2022), 28, 1428-1436. Retrieved Feb. 8, 2023 at URL: https://www.cambridge.org/core/services/aop-cambridge-core/content/view/7A31C592194246BAA680266CBC0D6525/S1431927621013908a.pdf/using-your-beam-efficiently-reducing-electron-dose-in-the-stem-via-flyback-compensation.pdf.

Müller et al. Atomic electric fields revealed by a quantum mechanical approach to electron picodiffraction. Nature Communications 5:5653 (Dec. 15, 2014). 8 pages.

Olshin et al. Atomic-Resolution Imaging of Fast Nanoscale Dynamics with Bright Microsecond Electron Pulses. Nano Lett. 2021, 21, 1, 612-618. Epub Dec. 10, 2020.

Ophus et al. Computational Methods for Large Scale Scanning Transmission Electron Microscopy (STEM) Experiments and Simulations. Microsc. Microanal. 23 (Suppl 1), pp. 162-163 (2017).

Ophus. Four-Dimensional Scanning Transmission Electron Microscopy (4D-STEM): From Scanning Nanodiffraction to Ptychography and Beyond. Microscopy and Microanalysis 25, 563-582 (2019). Retrieved Feb. 9, 2023 at URL: https://www.cambridge.org/core/services/aop-cambridge-core/content/view/A7E922A2C5BFD7FD3F208C537B872B7A/S1431927619000497a_hi.pdf/_div_class_title_Four-Dimensional_Scanning_Transmission_Electron_Microscopy_4D-STEM_From_Scanning_Nanodiffraction_to_Ptychography_and_Beyond_div_.pdf.

PCT/US2022/016479 International Search Report and Written Opinion dated May 31, 2022.

Peters et al. Improving the Noise Floor and Speed of Your Detector: A Modular Hardware Approach for Under $1000. Microsc. Microanal. 28 (Suppl 1), pp. 2904-2906 (2022). Retrieved Feb. 8, 2023 at URL: https://www.cambridge.org/core/services/aop-cambridge-core/content/view/DB98785BA272EA7BDCD028F3EE180C36/S143192762201090Xa.pdf/improving-the-noise-floor-and-speed-of-your-detector-a-modular-hardware-approach-for-under-dollar1000.pdf.

Piazza et al. Design and implementation of a fs-resolved transmission electron microscope based on thermionic gun technology. Chemical Physics 423 (2013) 79-84. Available online Jul. 9, 2013.

Piazza et al. Simultaneous observation of the quantization and the interference pattern of a plasmonic near-field. Nature Communications, 6:6407 (Mar. 2, 2015). 7 pages.

Price Schedule. IDES. Provided to Sales Team Apr. 21, 2020. One page.

Qiu et al. GHz laser-free time-resolved transmission electron microscopy: A stroboscopic high-duty-cycle method. Ultramicroscopy, vol. 161, pp. 130-136 (Feb. 2016). Retrieved Mar. 14, 2022 at URL: https://www.sciencedirect.com/science/article/am/pii/S030439911530067X.

Reed et al. Background Removal and Data Analysis for Low-Loss Transmission Electron Energy-Loss Spectroscopy. Microscopy and Microanalysis, 8(S02), 598-599 (2002).

Reed et al. Compressively Sensed Video Acquisition in Transmission Electron Microscopy. Microsc. Microanal. 23 (Suppl 1), pp. 84-85 (2017).

Reed et al. Electrostatic Switching for Spatiotemporal Dose Control in a Transmission Electron Microscope. Microsc. Microanal. 28 (Suppl 1), pp. 2230-2231 (2022). Retrieved Feb. 8, 2023 at URL: https://www.cambridge.org/core/services/aop-cambridge-core/content/view/C814A631FCD8F968290E892CA0D11A1D/S1431927622008595a.pdf/electrostatic-switching-for-spatiotemporal-dose-control-in-a-transmission-electron-microscope.pdf.

Rez et al. Damage-free vibrational spectroscopy of biological materials in the electron microscope. Nature Communications 7:10945 (Mar. 10, 2016). 8 pages.

(56) References Cited

OTHER PUBLICATIONS

Rosenauer et al. Measurement of composition profiles in III-nitrides by quantitative scanning transmission electron microscopy. J. Phys.: Conf. Ser. 209 012009 (2010). 4 pages.

Sanders et al. Inpainting vs denoising for dose reduction in scanning-beam microscopies. Manuscript received and revised. Published in IEEE Transactions on Image Processing, vol. 29, pp. 351-359 (2020). Retrieved Feb. 10, 2023 at URL: https://www.researchgate.net/profile/Toby-Sanders-2/publication/334526461_Inpainting_vs_denoising_for_dose_reduction_in_scanning-beam_microscopies/links/600eeda2a6fdccdcb87b76bd/Inpainting-vs-denoising-for-dose-reduction-in-scanning-beam-microscopies.pdf.

Sang et al. Revolving scanning transmission electron microscopy: Correcting sample drift distortion without prior knowledge. Ultramicroscopy 138 (2014) 28-35. Available online Dec. 31, 2013.

Specifications for Electrostatic Dose Modulator. Version 1.06. IDES, Inc. Apr. 20, 2020. Provided to Sales Team Apr. 21, 2020. 7 pages.

Stevens, et al. Applying compressive sensing to TEM video: a substantial frame rate increase on any camera. Advanced Structural and Chemical Imaging. 2015; 1(10):1-20.

Stroppa et al. High-Resolution Scanning Transmission Electron Microscopy (HRSTEM) Techniques: High-Resolution Imaging and Spectroscopy Side by Side. ChemPhysChem 2012, 13, 437-443.

U.S. Appl. No. 17/688,339 Notice of Allowance dated Jul. 11, 2022.
U.S. Appl. No. 17/688,339 Notice of Allowance dated May 4, 2022.
U.S. Appl. No. 17/825,261 Notice of Allowance dated Mar. 17, 2023.
U.S. Appl. No. 17/825,261 Office Action dated Jan. 24, 2023.

Vandenbussche et al. Mitigating Damage to Hybrid Perovskites Using Pulsed-Beam TEM. ACS Omega 2020, 5, 31867-31871.

Zhou et al. Non-Parametric Bayesian Dictionary Learning for Sparse Image Representations. In Advances in neural information processing systems, Bengio et al., eds., Neural Information Processing Systems Foundation, USA, vol. 22, pp. 2295-2303 (2009).

PCT/US2024/013606 International Search Report and Written Opinion dated Jul. 12, 2024.
PCT/US2024/013606 Invitation to Pay Additional Fees dated Apr. 8, 2024.
U.S. Appl. No. 18/104,101 Notice of Allowance dated Jul. 28, 2023.
U.S. Appl. No. 18/104,101 Office Action dated Apr. 20, 2023.
U.S. Appl. No. 18/201,536 Notice of Allowance dated May 1, 2024.

* cited by examiner

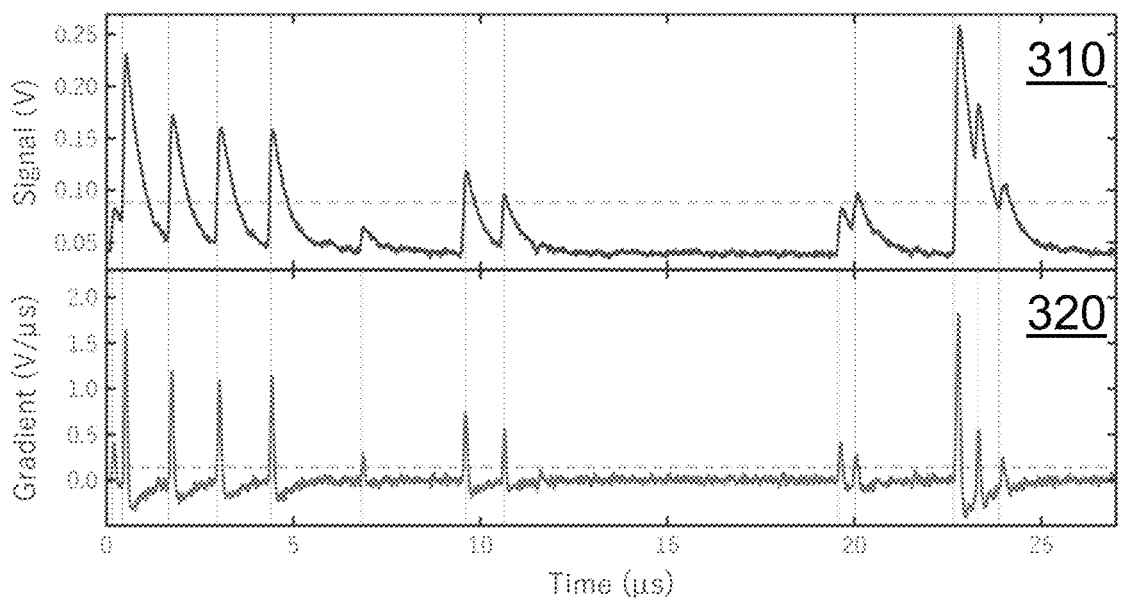
FIG. 3A
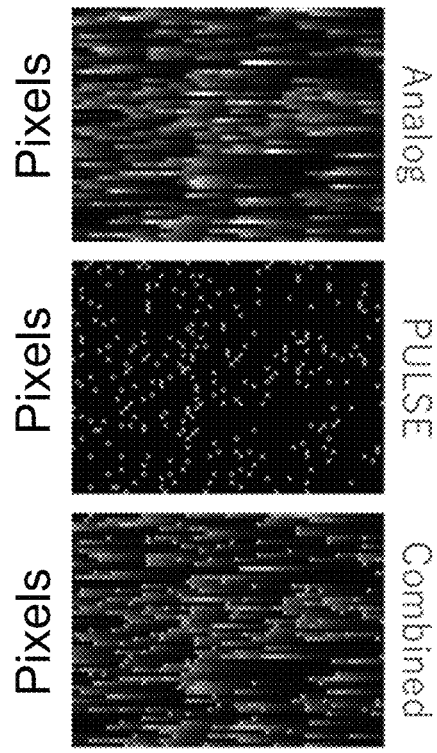
FIG. 3B
FIG. 3C
FIG. 3D

600

```
┌─────────────────────────────┐
│  Provide a threshold number of │
│  events or a threshold event rate │ ──── 610
│        for a pixel          │
└─────────────────────────────┘
              │
              ▼
┌─────────────────────────────┐
│ Collect from the detector the │
│  threshold number of events or │
│  determine that the threshold  │ ──── 620
│    event rate is achieved    │
└─────────────────────────────┘
              │
              ▼
┌─────────────────────────────┐
│   Modulate an intensity of an │
│  electron source directed to the │
│  sample in response to the    │ ──── 630
│          collecting          │
└─────────────────────────────┘
```

```
┌─────────────────────────────┐
│ Provide an information      │──── 810
│ threshold for a sample      │
└─────────────────────────────┘
              │
              ▼
┌─────────────────────────────┐
│ Collect from a detector a   │
│ number of events equal to   │
│ the information threshold   │
│ or determine that an        │──── 820
│ event rate equal to the     │
│ information threshold is    │
│ achieved                    │
└─────────────────────────────┘
              │
              ▼
┌─────────────────────────────┐
│ Form an image according to  │
│ the electron signal or the  │──── 830
│ electron induced signal     │
└─────────────────────────────┘
```

Provide a threshold number of events or a threshold event rate for a first pixel on a detector — 910

Record a time to achieve the threshold number of events or the threshold event rate at a second pixel — 920

1000

```
                  ┌──────────────────────────────┐
                  │  provide a pattern generator │
                  │  configured to produce an    │
                  │  electrical signal representative of │
                  │  an electron dose waveform   │──── 1010
                  │  having a continuously variable │
                  │  temporal profile            │
                  └──────────────────────────────┘
                                │
                                ▼
                  ┌──────────────────────────────┐
                  │ provide an event signal processor │
                  │ configured to receive an electron │
                  │ signal or an electron-induced │
                  │ signal from a detector and, in │
                  │ response, determine a number of │
                  │ electron events on the detector │
                  │ based on a rising edge of the │──── 1020
                  │ electron signal or the electron- │
                  │ induced signal at the detector, │
                  │ wherein the event signal │
                  │ processor comprises single event │
                  │ resolution.                  │
                  └──────────────────────────────┘
```

FIG. 10

METHODS AND SYSTEMS FOR EVENT MODULATED ELECTRON MICROSCOPY

CROSS-REFERENCE

This application is a continuation of U.S. Application Ser. No. 18/104,101, filed Jan. 31, 2023, now U.S. Pat. No. 11,848,173, which is incorporated herein by reference in its entirety for all purposes.

BACKGROUND

In a scanning electron microscope (SEM) or a scanning transmission electron microscope (STEM), a focused probe of electrons may be rastered across a specimen. The interaction of the electron beam with the sample material may produce a wide variety of signals which may then be individually or collectively captured to produce an image. Still other signals may contain chemical, bonding, electronic, diffraction or some other data. This data may be measured point-by-point as the beam is rastered. However, the electron beam, which is intended to measure the properties of a sample, may change the sample and may even damage the sample.

SUMMARY

Applicant has recognized that there is an unmet need for new methods and systems for reducing an effect of an electron dose on a sample while also maintaining the electron signal from the sample. While turning down the dose rate incident on a sample (e.g., the electron beam) reduces sample damage, all other variables held constant, the signal reduces as well. Systems and methods disclosed herein may employ an electron dose modulator with an arbitrary trigger signal in combination with a digital detector with a "fast" response rate. A digital detector with a fast response rate may detect individual electron impact events using the sharp rising edge accompanying an electron's arrival at the detector. Using both the dose modulator and the event detector, systems and methods of the present disclosure may switch the electron beam with precise control (e.g., of the order of 10 nanoseconds). Control over beam switching may allow for blanking of the electron beam once enough information (or even a single event) is detected. For example, in each pixel, when enough information is collected, the beam may be shut off and data collection may move on to the next pixel.

In an aspect, the present application provides a method for measuring an electron signal or an electron induced signal. The method may comprise (a) providing a threshold number of events or a threshold event rate for an element or a portion of a detector; (b) collecting from the detector the threshold number of events or determining that the threshold event rate is achieved, wherein a signal at the detector is an electron signal or an electron induced signal from a sample; and (c) modulating an intensity of an electron/ion source directed to the sample in response to the collecting in (b).

In some embodiments, (c) comprises moving the electron/ion source to another position on the sample. In some embodiments, (c) comprises turning the electron/ion source off. In some embodiments, (c) comprises use of a deflector. In some embodiments, (c) is performed in substantially "real time." In some embodiments, real time comprises substantially within an electron counting interval of the detector. In some embodiments, the threshold number of events or the threshold event rate is determined based on information about the sample.

In some embodiments, (c) comprises modulating an electron/ion dose waveform, wherein the electron does waveform is continuously updated based on a number of events determined from the signal. In some embodiments, the electron/ion dose waveform comprises a continuously variable temporal profile. In some embodiments, the electron/ion dose waveform comprises an arbitrarily defined temporal profile. In some embodiments, the arbitrarily defined temporal profile comprises a temporal resolution of less than 10 ns. In some embodiments, the method further comprises receiving an indication of the arbitrarily defined temporal profile from a user. In some embodiments, the electron/ion dose waveform comprises a series of waypoints. In some embodiments, the series of waypoints are individually or collectively selectable to construct the arbitrarily defined temporal profile. In some embodiments, the series comprises greater than 1000 waypoints.

In some embodiments, the method further comprises recording a time to achieve the threshold number of events or the threshold event rate at the element or the portion of the detector. In some embodiments, the method further comprises forming an image according to the time to achieve the threshold number of events or the threshold event rate for a plurality of elements or portions of the detector. In some embodiments, the method further comprises collecting from the detector the threshold number of events or determining that the threshold event rate is achieved, wherein a signal at the detector is an electron/ion signal or an electron/ion induced signal from or through a sample.

In some embodiments, the method further comprises subsequent to (c) providing the threshold number of events or the threshold event rate for a second element or a second portion of the detector.

In another aspect, a method of forming an image based on an electron event signal is provided. The method may comprise (a) providing a threshold number of events or a threshold event rate for a first element or portion of a detector; and (b) recording a time to achieve the threshold number of events or the threshold event rate at a second element or portion of the detector.

In some embodiments, the second element or portion is the element or the portion. In some embodiments, the second element or portion is another element or portion. In some embodiments, the method further comprises forming an image according to the time to achieve the threshold number of events or the threshold event rate for a plurality of element or portions of the detector. In some embodiments, a signal at the detector is an electron signal or an electron induced signal from a sample. In some embodiments, the electron signal or the electron induced signal is a single electron signal.

In some embodiments, the method further comprises (c) collecting from the detector the threshold number of events or determining that the threshold event rate is achieved. In some embodiments, the method further comprises (d) modulating an intensity of an electron/ion source directed to the sample in response to the collecting in (c). In some embodiments, (d) comprises moving the electron source to another position on the sample. In some embodiments, (d) comprises turning the electron/ion source off. In some embodiments, (d) comprises use of a deflector. In some embodiments, (d) is performed in substantially "real time." In some embodiments, real time comprises substantially within an event counting interval of the detector. In some embodiments, the threshold number of events or the threshold event rate is determined based on information about the sample.

In some embodiments, (d) comprises modulating an electron/ion dose waveform, wherein the electron does waveform is continuously updated based on a number of events determined from the signal. In some embodiments, the electron/ion dose waveform comprises a continuously variable temporal profile. In some embodiments, the electron/ion dose waveform comprises an arbitrarily defined temporal profile. In some embodiments, the arbitrarily defined temporal profile comprises a temporal resolution of less than 10 ns. In some embodiments, the method further comprises receiving an indication of the arbitrarily defined temporal profile from a user. In some embodiments, the electron/ion dose waveform comprises a series of waypoints. In some embodiments, the series of waypoints are individually or collectively selectable to construct the arbitrarily defined temporal profile. In some embodiments, the series comprises greater than 1000 waypoints.

In another aspect, the present disclosure provides a method of forming an image based on an electron event signal. The method may comprise (a) providing an information threshold for a sample; (b) collecting from the detector a number of events equal to the information threshold or determining that an event rate equal to the information threshold is achieved, wherein a signal at the detector is an electron signal or an electron induced signal from the sample; and (c) forming an image according to the electron signal or the electron induced signal.

In some embodiments, the information threshold for the sample is based on a sum of total electron counts across the sample. In some embodiments, the electron signal or the electron induced signal is a single electron signal. In some embodiments, the method further comprises recording a time to achieve the threshold number of events or the threshold event rate at the pixel.

In some embodiments, the method further comprises (d) modulating an intensity of an electron/ion source directed to the sample in response to the collecting in (b). In some embodiments, (d) comprises moving the electron/ion source to another position on the sample. In some embodiments, (d) comprises turning the electron/ion source off. In some embodiments, (d) comprises use of a deflector. In some embodiments, (d) is performed in substantially "real time." In some embodiments, real time comprises substantially within an electron counting interval of the detector. In some embodiments, the threshold number of events or the threshold event rate is determined based on information about the sample.

In some embodiments, (d) comprises modulating an electron/ion dose waveform, wherein the electron dose waveform is continuously updated based on a number of events determined from the signal. In some embodiments, the electron/ion dose waveform comprises a continuously variable temporal profile. In some embodiments, the electron/ion dose waveform comprises an arbitrarily defined temporal profile. In some embodiments, the arbitrarily defined temporal profile comprises a temporal resolution of less than 10 ns. In some embodiments, the method further comprises receiving an indication of the arbitrarily defined temporal profile from a user. In some embodiments, the electron/ion dose waveform comprises a series of waypoints. In some embodiments, the series of waypoints are individually or collectively selectable to construct the arbitrarily defined temporal profile. In some embodiments, the series comprises greater than 1000 waypoints.

In another aspect, the present disclosure provides a method for measuring an electron signal or an electron induced signal. The method may comprise (a) providing a pattern generator configured to produce an electrical signal representative of an electron/ion dose waveform having a continuously variable temporal profile; and (b) providing an event signal processor configured to receive an electron signal or an electron-induced signal from a detector and, in response, determine a number of electron events on the detector based on a rising edge of the electron signal or the electron-induced signal at the detector, wherein the event signal processor comprises single event resolution.

In some embodiments, the method further comprises modulating the electron/ion signal based on the number of electron events. In some embodiments, the method further comprises performing the method of any aspect or embodiment.

In another aspect, the present disclosure provides a device comprising a controller, the controller comprising a non-transitory storage medium with instructions stored thereon, wherein the instructions when executed by the controller are configured to perform the method of any aspect or embodiment.

In another aspect, the present disclosure provides a device. The device may comprise a deflector positioned between an electron/ion source and a sample area, wherein the deflector modulates an intensity of the electron/ion source directed to the sample area according to an electron/ion dose waveform having a continuously variable temporal profile; a detector configured to receive an electron signal or an electron-induced signal related to the sample area, wherein an electron event on the detector is correlated to a rising edge of the electron signal or the electron-induced signal at the detector; and a controller operably coupled to the deflector and the detector, wherein the controller is configured to determine the continuously variable temporal profile in response to the electron event.

In some embodiments, the controller comprises one or more field programmable gate arrays. In some embodiments, the device further comprises a first field programmable gate array configured to control the deflector. In some embodiments, the device further comprises a first field programmable gate array configured to control the detector. In some embodiments, the device further comprises an event signal processor configured to receive an electron signal or an electron-induced signal from a detector and, in response, determine a number of electron events on the detector based on a rising edge of the electron signal or the electron-induced signal at the detector.

In some embodiments, the event signal processor is a part of the controller. In some embodiments, the event signal processor is separate from the controller. In some embodiments, the event signal processor comprises single event resolution. In some embodiments, the event signal processor is configured to determine a gradient of the electron signal or the electron-induced signal. In some embodiments, the electron event is correlated with the gradient being above a threshold gradient value.

In some embodiments, the device further comprises a scintillator, wherein a scintillation signal is created in response to the electron signal or the electron-induced signal, and wherein the event signal processor is configured to receive the scintillation signal. In some embodiments, the event signal processor comprises an output signal, wherein the output signal is operably coupled to the controller to determine the continuously variable temporal profile. In some embodiments, the output signal is an instantaneous trigger signal.

In some embodiments, the controller is configured to determine a time to keep the electron signal on in response to the electron event signal. In some embodiments, the continuously variable temporal profile is modulated in "real time." In some embodiments, real time comprises substantially within an electron counting interval of the detector. In some embodiments, the detector comprises a plurality of detectors or detector segments. In some embodiments, the detector comprises an image sensor. In some embodiments, the detector comprises a single channel detector. In some embodiments, the detector is a multichannel detector. In some embodiments, the device is configured to detect from multiple channels in parallel.

In some embodiments, the waveform comprises a series of waypoints. In some embodiments, the series comprises greater than 1000 waypoints. In some embodiments, the electron/ion dose waveform comprises an arbitrarily defined temporal profile. In some embodiments, the series of waypoints are individually or collectively selectable to construct the arbitrarily defined temporal profile. In some embodiments, the arbitrarily defined temporal profile comprises a temporal resolution of less than 10 ns. In some embodiments, the arbitrarily defined temporal profile is indicated by a user.

In some embodiments, the deflector comprises a driving electrode and an electrode at a fixed voltage. In some embodiments, the deflector comprises two driving electrodes. In some embodiments, the electron/ion dose waveform modulates an average intensity of the electron/ion source directed toward the sample area. In some embodiments, the average intensity is modulated substantially without change to other image conditions. In some embodiments, the average intensity is controllable independently of a driving voltage of the electron/ion source. In some embodiments, the average intensity is continuously variable across a range from 0 to 100% dose transmission. In some embodiments, the electron/ion dose waveform comprises a periodic waveform. In some embodiments, the electron/ion dose waveform is aperiodic. In some embodiments, the electron/ion dose waveform comprises a pump and a probe pulse.

In some embodiments, the electron/ion dose waveform is a square wave. In some embodiments, a transition time between a high voltage and a low voltage is less than about 50 ns, defined as a sum of a ringing time plus a slope time. In some embodiments, a transition time between a high voltage and a low voltage is less than about 10 ns, defined as a slope time from about 10% to about 90% a transition voltage. In some embodiments, a pulse width of the square wave is aperiodic. In some embodiments, the electron/ion dose waveform comprises a shortest exposure time of about 100 ns.

In some embodiments, the device further comprises a pattern generator configured to produce an electrical signal representative of the electron/ion dose waveform; and a driver electronics configured to receive the electrical signal from the pattern generator and supply a voltage comprising the electron/ion dose waveform to the deflector. In some embodiments, the device further comprises one or more computer processors comprising instructions that when executed are configured to: receive an indication of the electron/ion dose waveform; and deliver the indication to the pattern generator.

In another aspect, the present disclosure provides a method for measuring an electron signal or an electron induced signal comprising providing the device of any aspect or embodiment.

In some embodiments, the threshold number of events or the threshold event rate is an information threshold.

In another aspect, the present disclosure provides a method for measuring an electron signal or an electron induced signal. The method may comprise (a) providing an information threshold for an element or a portion of a detector; (b) determining that the information threshold is achieved, wherein a signal at the detector is an electron signal or an electron induced signal from a sample; and (c) modulating an intensity of an electron/ion source directed to the sample in response to the collecting in (b).

In some embodiments, the method further comprises providing the device of any aspect or embodiment.

In some embodiments, (c) comprises moving the electron/ion source to another position on the sample. In some embodiments, (c) comprises turning the electron/ion source off. In some embodiments, (c) comprises use of a deflector. In some embodiments, (c) is performed in substantially "real time." In some embodiments, real time comprises substantially within an electron counting interval of the detector.

Another aspect of the present disclosure provides a system comprising one or more computer processors. In some cases, the system comprises a one or more computer processors and computer memory coupled thereto. The computer memory comprises machine executable code that, upon execution by the one or more computer processors, implements any of the methods above or elsewhere herein.

Another aspect of the present disclosure provides a system comprising a field programmable gate array (FPGA) or an application-specific integrated circuit (ASIC). The FPGA or ASIC comprises programmable logic blocks, programmable interconnects, etc. that are configured to implement any of the methods above or elsewhere herein. The system may comprise one or more computer processors and computer memory coupled thereto. The one or more computer processors may be configured to provide information to the FPGA or ASIC to implement any of the methods above or disclosed herein.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

FIG. 3A illustrates example single-electron impact event traces, in accordance with some embodiments.

FIGS. 3B-3D show signal (intensity) on a line of pixels (vertical) as a function of time (horizontal) for each an analogue signal, a signal from an event process, and a combination of the two.

FIG. 6 shows an example method for measuring an electron signal or an electron induced signal.

FIG. 8 shows an example method of forming an image based an electron event signal.

FIG. 10 shows another example method for measuring an electron signal or an electron induced signal.

DETAILED DESCRIPTION

Figure 1A:
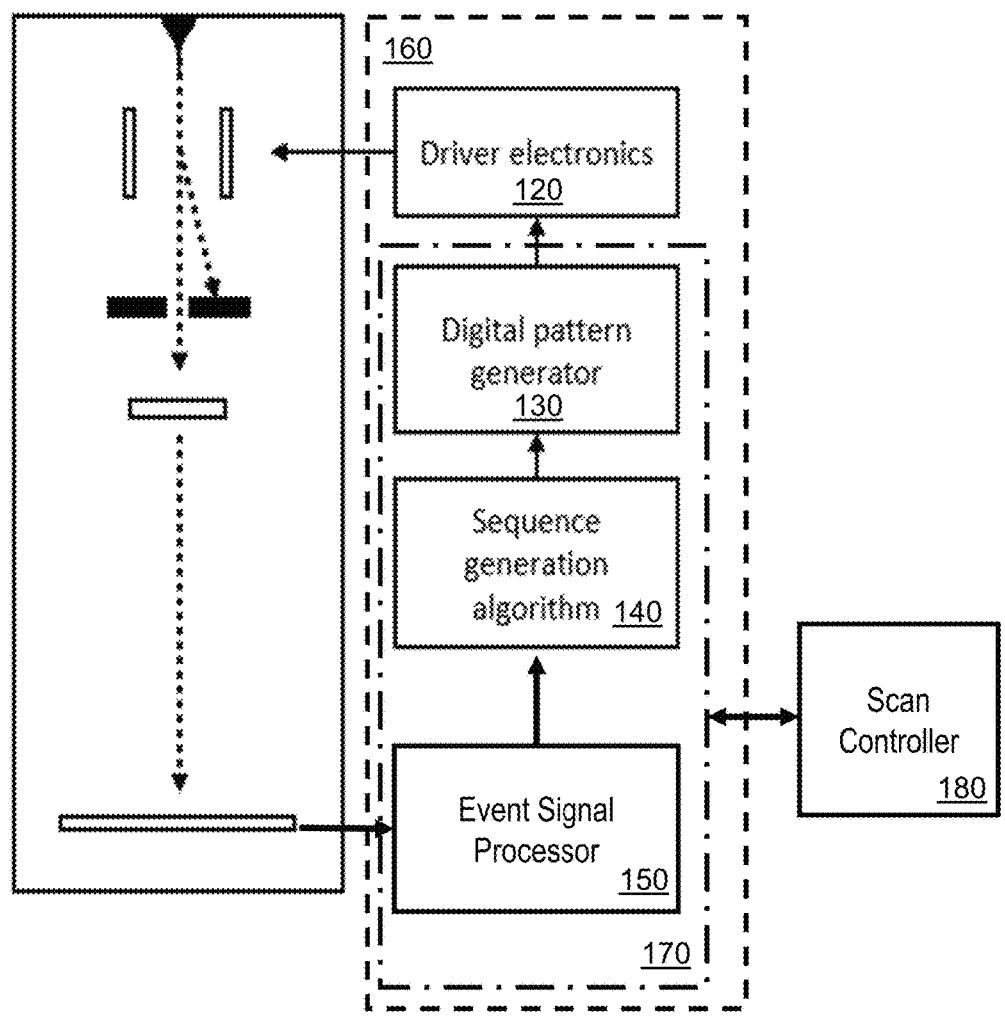
FIG. 1A schematically illustrates a device for collecting an electron signal of the present disclosure.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Systems and methods disclosed herein may use event-driven beam blanking to improve the information return per electron in an electron imaging system, e.g., a STEM, a SEM, etc. An electronic device may monitor the signal from a counting detector or a plurality of such detectors during a pixel dwell time. When the signal detected during a pixel dwell time passes one or more predetermined thresholds, the beam may be shut off for the remainder of the dwell time. Optionally (if using a scan controller that supports an input pixel clock signal, e.g., a "triggerable" controller), at this time a signal is sent that accelerates the transition to the next pixel. The ratio of the number of detected electrons to the beam-on duration for that pixel then becomes an unbiased estimator of the total signal that may have been detected if the electron beam had been left on for the entire dwell time. This can be used to generate, in real time, a high-quality image or set of images that are qualitatively similar to images acquired by other methods but with substantially reduced radiation damage to the sample. In the case of a triggerable scan controller, the acquisition time may also be substantially reduced.

The threshold may be as simple as turning off the beam after detecting some specified number n (including the very simplest case of n=1) of electrons on a single detector, or it may be adaptive or may involve a series of rules. For example, a rule may involve various detection rates on multiple detectors or detector segments.

A benefit of the present disclosure is that it realizes that there may be diminishing returns on information. There may be more information per electron for the earlier electrons. Thus, it may be advantageous not to collect for a long duration on a single spot but to determine that a sufficient amount of information is acquired and to move on. From the perspective of device construction, single electron counting coupled with continuous dose modulating may allow for stopping dosing in response to real time data.

Definitions: Unless otherwise defined, all of the technical terms used herein have the same meaning as commonly understood by one of ordinary skill in the art in the field to which this disclosure belongs.

As used in this specification and the appended claims, the singular forms "a", "an", and "the" include plural references unless the context clearly dictates otherwise. Any reference to "or" herein is intended to encompass "and/or" unless otherwise stated.

As used herein, and unless otherwise specified, the term "about" or "approximately" means an acceptable error for a particular value as determined by one of ordinary skill in the art, which depends in part on how the value is measured or determined. In some case, the term "about" or "approximately" means within 1, 2, 3, or 4 standard deviations. In some cases, the term "about" or "approximately" means within 30%, 25%, 20%, 15%, 10%, 9%, 8%, 7%, 6%, 5%, 4%, 3%, 2%, 1%, 0.5%, 0.1%, or 0.05% of a given value or range. In some cases, the term "about" a number refers to that number plus or minus 10% of that number. In some cases, the term "about" when used in the context of a range refers to that range minus 10% of its lowest value and plus 10% of its greatest value.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

Certain inventive embodiments herein contemplate numerical ranges. When ranges are present, the ranges include the range endpoints. Additionally, every sub range and value within the range is present as if explicitly written out.

As disclosed herein, the term "cross-section" generally refers to a scattering cross-section. Cross-section generally does not refer to the geometric cross-section but instead to the effective area for collision. The cross-section expresses the probability of scattering from the sample within the associated interaction time. This may be expressed mathematically in units of area.

Electron Imaging Systems

FIG. 1A schematically illustrates a device for collecting an electron signal of the present disclosure. The device may be an imaging device. The device may be a device for collecting an electron event signal. The device may be an electron microscope. For example, the device may comprise a scanning transmission electron microscope. For example, the device may comprise a electron beam lithograph. In some cases, the device may be a device for collecting an ion event signal. For example, the device may comprise a focused ion beam directed to a sample or a helium ion beam directed at a sample. In some cases, the device includes an annular dark-field (ADF) electron detector and may thereby implement annular dark-field scanning transmission electron microscopy (ADF-STEM). However, systems such as those disclosed herein may also be used in conjunction with other electron microscopy and electron spectroscopy applications, such as serial-section electron microscopy (ssEM), scanning electron microscopy (SEM), reflection electron microscopy (REM), scanning transmission electron microscopy (STEM), transmission electron microscopy (TEM), etc. Many of the above are instruments capable of more than one of these operating modes. Further, there are variations in geometry such that the electron or ion source may be on the bottom or the side of the instrument and the beam may travel upwards or horizontally. The various techniques above may employ various sensing modalities including one or more of: low-dose imaging; digital electron counting; electrostatic dose modulation (EDM), or compressed Sensing (CS), or adaptive subsampling, or non-raster scan patterns, or any combination thereof.

Various examples of high-resolution scanning transmission electron microscopy are provided in D. G. Stroppa, L. F. Zagonel, L. A. Montoro, E. R. Leite, and A. J. Ramirez, High-Resolution Scanning Transmission Electron Microscopy (HRSTEM) Techniques: High-Resolution Imaging and Spectroscopy Side by Side, ChemPhysChem, which is incorporated herein by reference in its entirety.

As shown, device 100 may comprise an electron source 102, a deflector 106, an aperture 108, a sample 110, and a detector 104. Device 100 may also comprise various analogue or digital electronic components. The various electronic components may comprise, for example, drive electronics 120, a digital pattern generator 130, a sequence generation algorithm 140, an event signal processor 150, and a scan controller 180.

In some cases, the device may be a STEM device. For example, the device may be an ADF-STEM device. In some cases, in ADF-STEM, an at least partially transparent sample may be investigated with an electron beam. For example, the sample may be thin such that the sample is at least partially electron transparent. In some cases, the electron beam may be focused by one or more electrostatic or electromagnetic lenses. When the incoming beam (sometimes called the primary beam) passes through the sample, a small proportion of this irradiation may be scattered to an angle, e.g., by so-called Rutherford scattering. This scattering may be collected using an annular detector placed beyond the sample. In some cases, an image may be created by rastering the electron beam across the sample. At each probe position in the raster, the total scattered intensity may be logged and represented in the same position in the image coordinates. As the probe scans, an image may be built up pixel-by-pixel. Regions (pixels) of greater scattering yield increased brightness in the image while vacuum regions appear black (hence the name-dark-field).

In some cases, the irradiation may be delivered at a consistent rate (fixed electron beam current) and for a consistent time (e.g., the dwell-time) before moving the focused electron beam to a new pixel location and repeating the process. In some cases, the image of the recorded signal is displayed in arbitrary units as this is sufficient for many qualitative studies.

Figure 1B:
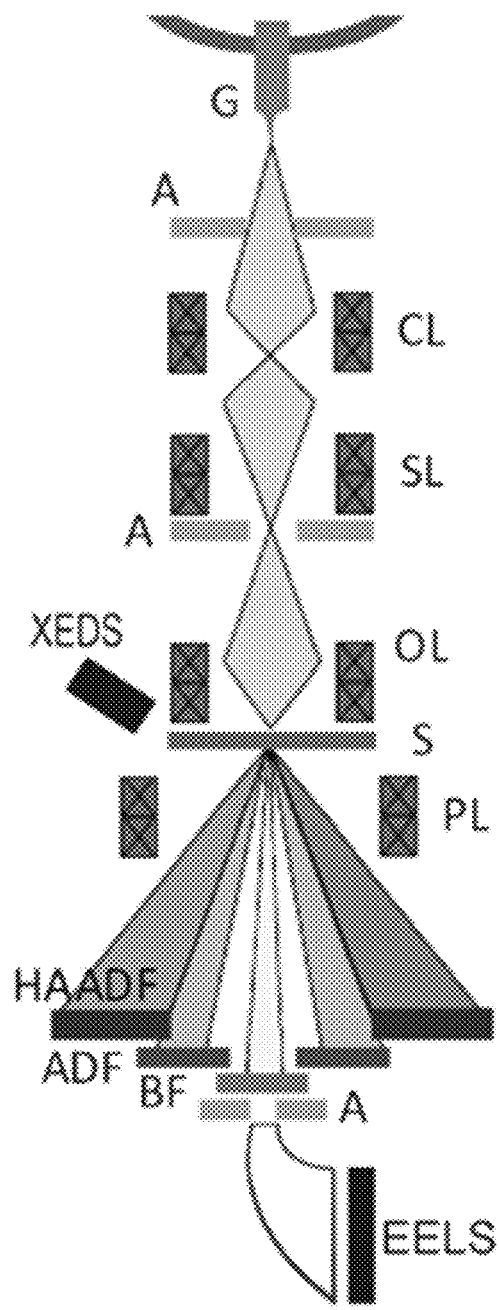
FIG. 1B schematically illustrates a scanning transmission electron microscope, in accordance with some embodiments.

FIG. 1B schematically illustrates a scanning transmission electron microscope, in accordance with some embodiments. As shown, device 100' may comprise an electron gun G, one or more apertures A, one or more electrostatic lenses (e.g., one or more condenser lenses CL, one or more scanning lenses SL, one or more objective lenses OL, one or more projector lenses PL), a sample S, one or more detectors (e.g., a bright field detector BF, an annual dark-field detector ADF, a high angle annular dark field detector HAADF, an x-ray detector XEDS, an electron energy loss spectrometry detector EELS, etc.). As shown, device 100' shows multiple detectors for multiple different image modalities.

Electron source: As shown in FIG. 1A, an electron source 102 may be provided. The electron source may emit electrons at a controllable acceleration voltage. The electron source may emit electrons in the direction of the sample area. The electron source may comprise an electron gun (e.g., G in FIG. 1B). The electron source may comprise a hot filament source which emits electrons. The electron source may comprise a field emission source which emits electrons. The electron source may comprise one or more acceleration optics. For example, the acceleration optics may comprise a cathode and an anode. The anode may comprise a controllable electrode voltage to accelerate the electrons away from the filament at a selectable voltage. The electron source may comprise a series of electron optics to shape a spatial profile of the electron source. For example, the electron source may comprise one or more electrostatic or electromagnetic lenses. The one or more lenses may comprise one or more condenser lenses CL, one or more scanning lenses SL, one or more objective lenses OL, one or more projector lenses PL, for example, as shown in FIG. 1B. A condenser lens may be used as a first step focus of the electrons from the electron source, as disclosed herein. A scanning lens may at least partially aid in steering the electron source. Alternatively, the scanning lens may adapt the focus of the lens as the electron source is scanned. In some cases, the device does not comprise a scanning lens, and the electron source may be primarily steered by the deflectors. In some cases, the electron source may be directed toward the sample by one or more steering deflectors. The steering deflector may or may not also be used to control the temporal profile of the electron dose waveform that arrives at the sample area.

Electron detector: As shown in FIG. 1A, a detector 104 may be provided. The detector may receive an electron signal that has propagated through the sample area or an electron-induced signal from the sample area. The detector may be a two-dimensional detector array. A two-dimensional detector array may in some instances comprise a single detector, e.g., a CCD or CMOS image sensor, comprising a two-dimensional array of individual pixels or groupings of pixels, or in some instances may refer to a two-dimensional array of individual detectors, e.g., a two-dimensional array of CCD or CMOS image sensors. In some instances, a two-dimensional detector array may comprise a two-dimensional array of individual detectors that include a combination of CMOS image sensors, CCD image sensors, dark-field STEM detectors, Faraday cup sensors, or other types of detectors. In some instances, the detector may comprise an energy dispersive X-ray spectrometer (EDS). An EDS detector may measure an electron-induced signal. For example, an EDS detector may measure x-rays which are generated as an electron beam hits the sample area. In some cases, X-rays may be generated when an electron beam hits and interacts with a sample as it passes through a sample area.

Examples of suitable detectors for use in the disclosed methods and systems include, but are not limited to, charge-coupled device (CCD) image sensors and cameras that include a layer that emits photons when struck by an electron, complementary metal oxide semiconductor (CMOS) image sensors and cameras that include a layer that emits photons when struck by an electron, electron direct detection (EDD) image sensors and cameras (e.g., CCD, CMOS, or hybrid-pixel image sensors which have been designed to detect electrons directly), time-of-flight (ToF) image sensors and cameras, dark-field STEM detectors, Faraday cups, quad photodiodes, annular dark field detectors, bright field detectors, universal detectors, or any combination thereof.

The one or more detectors may comprise at least one member selected from the group consisting of a bright field detector, an annual dark-field detector, a high angle annular dark field detector, an x-ray detector, an electron energy loss spectrometry detector, or any combination thereof. In some cases, the detector comprises a plurality of detectors or detector segments. In some cases, the detector comprises an image sensor. In some cases, the detector comprises a single channel detector. In some cases, the detector is a multichannel detector. In some cases, the device is configured to detect from multiple channels in parallel. Further examples with multichannel detectors are described herein with respect to the section "Multiple Detector Segments."

Electron deflector: As shown in FIG. 1A, a deflector 106 may be provided. A deflector may be positioned between the electron source and the sample. Systems and methods of the present disclosure may use a fast electrostatic deflector. The fast electrostatic deflector may be placed after the source of the electron beam in a TEM. In some examples, when no voltage is applied, the electron beam may transmit normally, and when a voltage is applied, the electrons may be deflected at an angle such that they do not pass through an aperture, and they do not reach the sample. In this way, the beam may be rapidly turned on and off. In some cases, a beam may propagate through an aperture 108. The voltage applied at a deflector may control whether the electron beam propagates through the aperture or is blocked by the aperture.

The deflector 106 may modulate an intensity of the electron source directed to the sample area. The modulation may be achieved through one or a combination of the following: pulse width modulation (PWM), pulse density modulation (PDM), or delta modulation (DM). The modulation of the electron source by the deflector may relate to an electron dose waveform. The waveform provided may modulate an amount of electrons (e.g., a dose) which arrives at the sample area. In some cases, the waveform may determine a temporal profile of an average dose at the sample area. In some examples, a waveform which determines a temporal profile of the average dose may be provided. The temporal profile of the average dose may be indicated by the user. The indicated temporal profile may be converted to a waveform. The conversion to a waveform may be performed or aided by a processor comprising instruction as disclosed herein. The waveform may be an on-off waveform which varies the average dose with time. The waveform may be amplified to an operating voltage and applied to a fast electrostatic deflector.

The deflector may comprise one or more electrodes. The deflector may comprise two or more pairs of electrodes. Each pair of electrodes may move electrons in a different direction. In some examples, the various pairs of electrodes may move electrons in a different axis. In the example shown, the detector has two electrodes which are shaped like plates.

In some cases, the deflector comprises a driving electrode and an electrode at a fixed voltage. In some cases, the deflector comprises a driving electrode near a portion of the microscope, which is held at a fixed voltage and which acts as a second electrode at a fixed voltage. In some instances, the portion of the microscope is a grounded beam tube. In some instances, the magnitude of the driving voltage may range from about 0 volts to about 10 kilovolts (kV). In some instances, the magnitude of the driving voltage may be at least 0 volts, at least 10 volts, at least 100 volts, at least 500 volts, at least 1,000 volts, at least 5 kV, or at least 10 kV. In some instances, the magnitude of the driving voltage may be at most 10 kV, at most 5 kV, at most 1,000 volts, at most 500 volts, at most 100 volts, at most 10 volts, or about 0 volts. In some cases, the driving voltage is within a range from about +/−100 to about +/−200 Volts (V). Any of the lower and upper values described in this paragraph may be combined to form a range included within the present disclosure, for example, the driving voltage may be within a range from about +/−1 to about +/−2,000 V, about +/−10 to about +/−1,000 V, about +/−20 to about +/−500 V, or about +/−50 to about +/−500 V.

In some cases, the deflector comprises two driving electrodes. For example, the two driving electrodes may have opposite voltages. The two driving electrodes may have equal and opposite voltages or unequal voltages. In some instances, the magnitude of the driving voltage may range from about 0 volts to about 10 kV. In some instances, the magnitude of the driving voltage may be at least 0 volts, at least 10 volts, at least 100 volts, at least 500 volts, at least 1,000 volts, at least 5 kV, or at least 10 kV. In some instances, the magnitude of the driving voltage may be at most 10 kV, at most 5 kV, at most 1,000 volts, at most 500 volts, at most 100 volts, at most 10 volts, or about 0 volts. In some cases, the driving voltage is within a range from about +/−100 to about +/−200 Volts (V). Any of the lower and upper values described in this paragraph may be combined to form a range included within the present disclosure, for example, the driving voltage may be within a range from about +/−1 to about +/−2,000 V, about +/−10 to about +/−1,000 V, about +/−20 to about +/−500 V, or about +/−50 to about +/−500 V.

Aperture: As shown in FIG. 1A, an aperture 108 may be provided. In some cases, there may be a plurality of apertures. For example, as shown in FIG. 1B, apertures may be provided on either side of the condenser lens and the scanning lens. The first aperture may aid in collimation of the electrons from the electron source. The second aperture may spatially filter to the electron beam from the scanning lens. In some cases, the device may also comprise an objective lens (OL) which may additionally focus the filtered electron beam before the electron beam proceeds to the sample S/110 herein.

Analogue and Digital Electronic Components: As shown in FIG. 1A, the device may comprise drive electronics 120; digital pattern generator 130, sequence generation algorithm 140, event signal processor 150, and scan controller 180. For example, a digital pattern generator may produce an electrical signal representative of the electron dose waveform. Driver electronics may receive the electrical signal from the pattern generator and supply a voltage comprising the electron dose waveform to the deflector. A sequence generation algorithm may receive an indication of an electron dose waveform to a user and deliver the indication to the pattern generator to produce an electrical signal. An event signal processor may process electron events from the detector and feed that even signal back into the sequence generation algorithm.

In some cases, the components drive electronics 120; digital pattern generator 130, sequence generation algorithm 140, and event signal processor 150 may individually or collectively comprise a controller 160 of the present disclosure. In some cases, the signal from the event signal processor may be conveyed to a controller comprising a driver electronics 120 and a digital pattern generator 130. In some cases, the controller may additionally comprise one or more examples of an event signal processor 150 of the present disclosure. In some cases, the controller may comprise one or more processors. In some cases, digital pattern generator 130, sequence generation algorithm 140, and event signal processor 150 may collectively comprise an electron dose modulator 170 of the present disclosure. In some cases, the controller comprises one or more field programmable gate arrays (FPGAs) or one or more ASICs. In some cases, the first field programable gate array configured to control the deflector. For example, the FPGA or ASIC may comprise drive electronics 120; digital pattern generator 130, and sequence generation algorithm 140. In some cases, drive electronics 120 are substantially analogue and digital pattern generator 130 and sequence generation algorithm 140 are parts of an FPGA or ASIC. In some cases, event signal processor 150 comprises a second field programmable gate array. In some cases, an electron dose modulator 170 is implemented on one FPGA or ASIC. In some cases, digital pattern generator 130, and sequence generation algorithm 140, and event signal processor 150 comprise an FPGA or an ASIC, and drive electronics 120 remains separate. For example, drive electronics 120 may comprise higher voltage switching circuits for the deflectors and may be shielded separately from the lower voltage components.

Device 100 may comprise scan controller 180. Scan controller 180 may comprise an example of a processor as disclosed herein with respect to section "Computer Systems" herein. In some cases, a scan controller can control and/or direction instructions to one or more components of an electron dose modulator or a controller herein.

Quantitative STEM: In some cases, it may be possible to calibrate the intensity of the scattered signal integrated within each time period during which the electron beam is on the sample (e.g., the dwell-time). The result is that when divided by the incoming primary beam-current, the data then has units of "fractional scattering." This fractional scattering may then be integrated over the area of (for example) individual atoms to yield a scattering cross-section. While it may be possible to determine the scattering-rate arising from this probability by summing all the scattering events within the pixel dwell-time, there exists the chance that radiation damage may occur when probing these materials.

Various examples of quantitative STEM methods are summarized in, for example, J. M. LeBeau and S. Stemmer, Experimental Quantification of Annular Dark-Field Images in Scanning Transmission Electron Microscopy, Ultramicroscopy 108, 1653 (2008) and A. Rosenauer, K. Gries, K. Müller-Caspary, M. Schowalter, A. Pretorius, A. Avramescu, K. Engl, and S. Lutgen, Measurement of Composition Profiles in III-Nitrides by Quantitative Scanning Transmission Electron Microscopy, J. Phys. Conf. Ser. 209, 012009 (2010), and L. Jones, Practical Aspects of Quantitative and High-Fidelity STEM Data Recording, Scanning Transm. Electron Microsc. 1 (2020), each of which are incorporated by reference in their entirety. Determination of scattering cross-sections may be disclosed, for example, in H. E, K. E. MacArthur, T. J. T. J. Pennycook, E. Okunishi, A. J. J. D'Alfonso, N. R. R. Lugg, L. J. Allen, and P. D. Nellist, Probe Integrated Scattering Cross Sections in the Analysis of Atomic Resolution HAADF STEM Images, Ultramicroscopy 133, 109 (2013), which is incorporated by reference in its entirety.

Because there is a likelihood of radiation damage, one approach is to reduce the beam-current (and thus dose intensity) used when making a measurement. In some cases, the beam-current may be reduced to an absolute minimum in highly damage prone samples. This results in less data per unit time.

The present disclosure provides an events-driven approach to addressing the twin issues of sample damage and increasing information collection. It may be advantageous to determine the scattering event rate. Rather than measuring this rate by total number of detected events divided by total time, the event driven approach proposed herein may be based around the concept that, for electron beam positions (pixel locations) with a high scattering rate, the time from the start of the pixel until the first event is short and, for regions of low scattering rate, the time until the first event is longer. Considering the delay time from the pixel-start to the first event to be the reciprocal of the scattering rate, the scattering rate data may be determined using the timing of the first scattering event.

In some cases, the delay time t may be counted from the pixel-start to the nth event, where the integer n is determined before the pixel-start time, providing an estimate n/t of the scattering rate. At least one, difference between the event driven approaches and other approaches is the following: while in some approaches, the time t is predetermined and the number of counts n is measured, in the event-driven approach, n is predetermined and t may be measured. The event-driven approach thereby may automatically reduce the measurement time when the scattering rate is high.

Event Signal Processor

Figure 2:
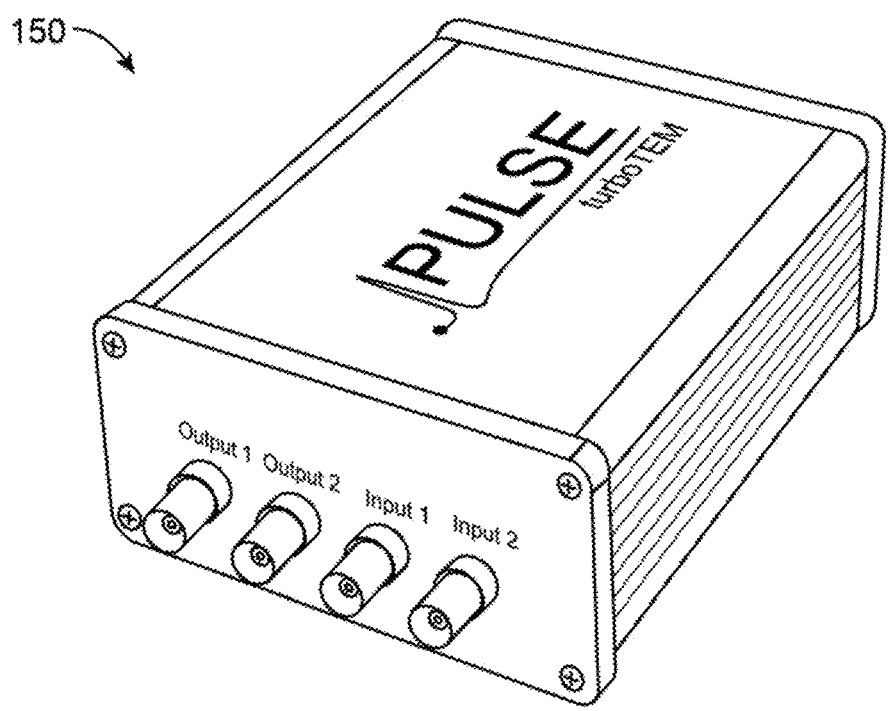
FIG. 2 illustrates an example of event signal processor 150 of the present disclosure.

FIG. 2 illustrates an example of event signal processor 150 of the present disclosure. As shown, event signal processor may comprise one or a plurality of inputs and one or a plurality of outputs. In some cases, the device comprises an event signal processor configured to receive an electron signal or an electron-induced signal from a detector. The event signal processor may determine a number of electron events on the detector in response to the detector. The event signal processor may determine a number of events based on a rising edge of the electron signal or the electron-induced signal at the detector.

In some cases, the event signal processor is a part of a controller disclosed herein. In some cases, the event signal processor is separate from the controller. In some cases, the event signal processor comprises single event resolution. In some cases, the event signal processor is configured to determine a gradient of the electron signal or the electron-induced signal. In some cases, the electron even is correlated with the gradient being above a threshold gradient value. In some cases, the event signal processor comprises a scintillator or is operably coupled to a scintillator. A scintillation signal may be created in response to the electron signal or the electron-induced signal and delivered as an input to the event signal processor.

In some cases, the event signal processor comprises an output signal. An output signal from the event signal processor may be fed into the electron dose modulator as a signal to determine the continuously variable temporal profile. The output signal may comprise an instantaneous trigger signal.

FIG. 3A illustrates example single-electron impact event traces, in accordance with some embodiments. As shown in panel 310, an electron signal is correlated with a rising edge and a falling edge. In the case where several electron impacts occur near one another in time, for example, at 22 microseconds in FIG. 3A, the signals from each electron may obscure one another. As shown in panel 320, the gradient of the signal may be provided. For example, the gradient may be hardware generator or calculated numerically (e.g., by software). The gradient of the signal may effectively sharpen the electron signal, improving the effective temporal resolution. As shown in panel 320, overlapping electron signals at similar event times may be separable. For example, at 22 microseconds, the three events appear as three clearly separate electron signals.

FIGS. 3B-3D show signal (intensity) on a line of pixels (vertical) as a function of time (horizontal) for each an analogue signal, a signal from an event process, and a combination of the two. FIG. 3B shows the analog processor alone. As shown, the signal in time appears as a streak. FIG. 3C shows the signal from the event signal processor (PULSE). As shown, the events appear as points. FIG. 3D shows the signal from both methods combined highlighting the change in the temporal profile. Thus, a fast electron event processor may enable improved single electron counting.

Additional details related to the event signal processor of the present disclosure may provide at least at: T. Mullarkey, C. Downing, and L. Jones, Development of a Practicable Digital Pulse Read-Out for Dark-Field STEM, Microsc. Microanal. 27, 99 (2021) and J. J. P. Peters, T. Mullarkey, and L. Jones, Improving the Noise Floor and Speed of Your Detector: A Modular Hardware Approach for Under $1000, Microsc. Microanal. 28, 2904 (2022), each of which is incorporated herein by reference in their entireties.

Electron Dose Modulator

Systems and methods of the present disclosure may also provide an electrostatic dose modulator (EDM) driven by an arbitrary trigger signal.

Figure 4:
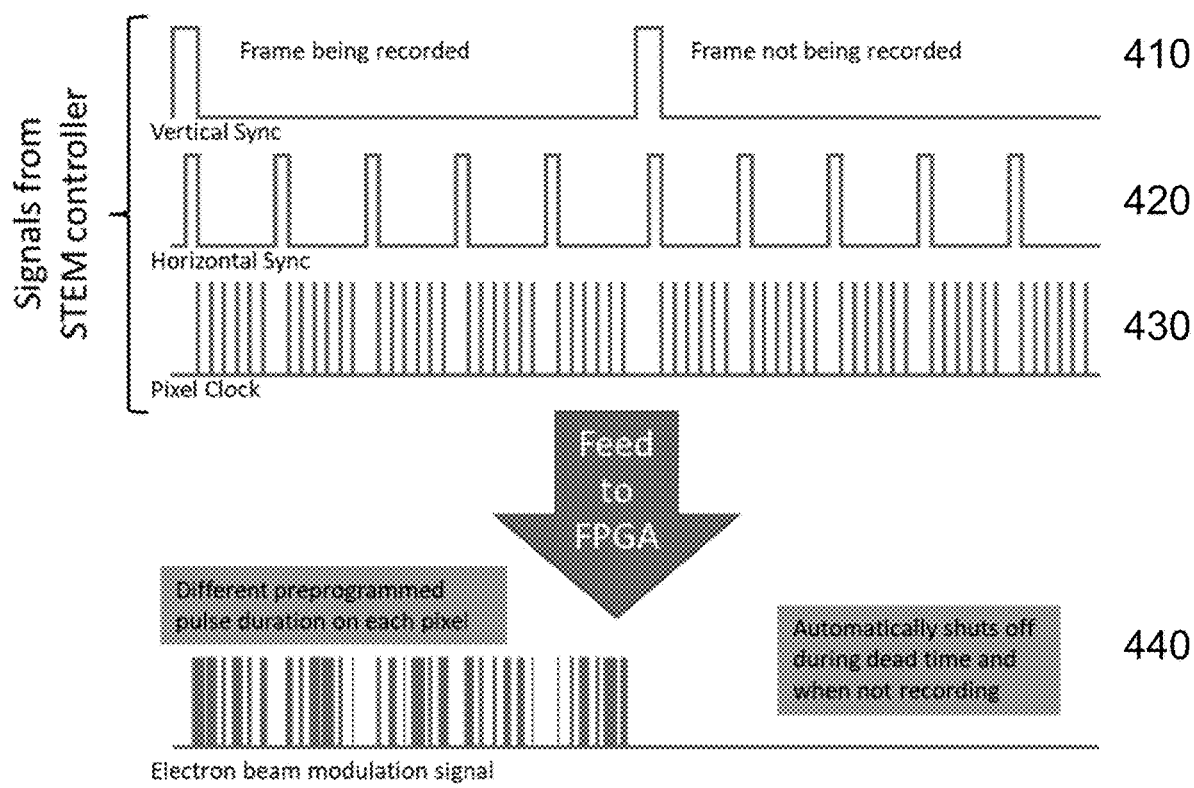
FIG. 4 illustrates an example of using variable blanking enabled by an electrostatic dose modulator driven by an arbitrary trigger signal.

FIG. 4 illustrates an example of using variable blanking enabled by an electrostatic dose modulator driven by an arbitrary trigger signal. The electron dose modulator may comprise drive electronics 120, digital pattern generator 130, and sequence generation algorithm 140. In some cases, the signal from the event signal processor may be conveyed to a controller comprising a driver electronics 120 and a digital pattern generator 130. In some cases, the controller may additionally comprise one or more examples of an event signal processor 150 of the present disclosure. In some cases, the modulating comprises use of a deflector. For example, the digital pattern generator may control a deflector which switches an electron source according to a pattern of the pattern generator. The pattern generator may be a low voltage signal which may be conveyed to a driver electronics. In some cases, the modulating comprises moving the electron source to another position on the sample. In some cases, the modulating comprises turning the electron source off.

A device may comprise driving electronics 120. The driving electronics receive an electrical signal from the digital pattern generator and output a voltage to drive the electrodes of the deflectors. The driving electronics may comprise a digital power amplifier. The digital power amplifier may mirror the incoming digital pattern at the deflector plates. The driving electronics may facilitate flexibility of the waveform in the PWM modulation scheme. The driving electronics may comprise analog signal conditioning components, e.g., low pass filter, high pass filter, DC offset, grounding, shielding, etc. The driving electronics may comprise separate channels for driving the electrodes.

The drive electronics may provide a fast transition time. In some cases, a transition between a high deflector voltage and a low deflector voltage may be characterized by a transition time. For example, a transition time between a high voltage and a low voltage is less than about 50 ns, defined as a sum of a ringing time plus a slope time. The drive electronics may provide a sustained high frequency. For example, a frequency provided by the drive electronics may be within a range from about 500 kHz (kilohertz) to about 1 MHz (megahertz) at a voltage of the electron beam within a range from about 80 kV to about 300 kV.

A device may comprise a pattern generator 130. The pattern generator may be an analog or a digital pattern generator. The digital pattern generator may take the indication of the waveform from the algorithm and produce an electrical signal representative of the electron dose waveform. The signal representative of the electron dose waveform may be a lower voltage signal than is provided to the deflectors by the driving electronics. The digital pattern generator may receive various parameters relating to the shape of the waveform. The parameters together may comprise an indication of a waveform. The various parameters may comprise an indication of any of the properties of the waveform as disclosed herein. The digital pattern generator may receive synchronization signals from other portions of the microscope as disclosed herein. The pattern generator may be programmable. The pattern generator may be integrated with other sensors and workflows within the microscope, such as described herein with respect to sequence generation algorithms. The digital pattern generator may comprise a pulse width modulator. The digital pattern generator may generate a DM, PWM, and/or PDM modulation scheme. The digital pattern generator may comprise a digital to analog (DAC) converter or an analog to digital converter (ADC). In some cases, the digital pattern generator comprises a DAC and/or ADC to control one or more components of the microscope for example to synchronize it with the dose waveform.

A device may comprise a sequence generation algorithm 140. The sequence generation algorithm may be an algorithm which may consider one or more of: information about the sample, deflection electronics, detectors involved in the measurement, and the determined waveform input into the control software by the user to form an indication of an electron dose waveform of the present disclosure.

In some cases, the electron dose waveform may modulate an average intensity of the electron source directed toward the sample area. In some cases, the average intensity may be modulated substantially without change to other image conditions. For example, a temporal profile of the waveform may be set, and an alignment of the instrument may be set, but it may be desirable to change an average intensity of the electron dose. In some cases, the average intensity is controllable independently of a driving voltage of the electron source.

Examples of electron dose modulators which may be used in combination with the present disclosure are provided, without limitation, in U.S. Pat. No. 11,476,082 and in B. W. Reed, R. S. Bloom, G. Eyzaguirre, C. Henrichs, A. A. Moghadam, and D. J. Masiel, Electrostatic Switching for Spatiotemporal Dose Control in a Transmission Electron Microscope, Microsc. Microanal. 28, 2230 (2022), each which is incorporated by reference herein in its entirety.

Referring again to FIG. 4, the figure shows three examples of signals which may be delivered from scan controller 180 to electron dose modulator 170 of the present disclosure. The signals may relate to an electron signal or an electron induced signal of the present disclosure.

In some cases, a signal from scan controller 180 may comprise trace 410. Trace 410 shows a vertical sync signal which may be directed through the electron dose modulator 170 to driver electronics 120 of the present disclosure. The vertical sync signal may control a first axis of a deflector of the present disclosure. Trace 410 shows a square pulse relating to one or more electron signals or electron induced signals. In trace 410, after a square pulse a frame may be recorded and after a second square pulse a frame may not be recorded.

In some cases, a signal from scan controller 180 may comprise trace 420. Trace 420 shows a horizontal sync signal which may be directed through the electron dose modulator 170 to driver electronics 120 of the present disclosure. The horizontal sync signal may control a second axis of a deflector of the present disclosure. Trace 420 shows a series of square pulses relating to one or more electron signals or electron induced signals. Trae 420 may comprise an on/off signal.

In some cases, a signal from scan controller 180 may comprise trace 430. Trace 430 shows a pixel clock signal which may be directed through the electron dose modulator 170 to driver electronics 120 of the present disclosure. The pixel clock signal may be directed to an electron dose modulator to form an arbitrary electron dose waveform of the present disclosure. Trace 430 shows a series of delta pulses relating to one or more electron signals or electron induced signals. In some cases, trace 430 may relate to single electron counts on one or more detectors or one or more portions of a detector.

In some cases, the digital pattern generator may receive a signal from the scan controller. The signal may comprise pixel clock signal 430. In some cases, the digital pattern generator may also receive the horizontal (410) and vertical (420) sync signals. These signals may inform the digital pattern generator where the beam is in the raster sequence, e.g., where the beam is being directed on the sample. In an example, when the digital pattern generator receives the nth electron count from the event signal processor in a single pixel dwell time, the digital pattern generator may provide a signal to the diver electronics to blank the beam until the next pixel clock, at which point it may reset the count to zero and repeat.

In some cases, the threshold may be a combination of total counts and counting rate, and it may vary as a function of position across the sample. The digital pattern generator may receive the timing signals and comprise information sufficient to understand where the beam is striking the sample. Using information from a previous (e.g., lower dose) scan of the same region, the user (or an algorithm such as a machine-learning algorithm) may distinguish different regions of the sample to receive larger or smaller dose depending on their propensity to take damage from the electron beam.

In some cases, the digital pattern generator may send some subset of signals 410, 420, and 430 to the driver electronics that control the scanning coils. The digital pattern generator may send out, for example, a uniformly-spaced pixel clock at a predetermined maximum pixel dwell time when the event signal processor was receiving no signal. In another example, if the threshold is reached before the end of this dwell time, then the next pixel clock signal may be sent early, and the scan may jump to the next pixel. This would have the effect of both reducing dose and increasing the speed of acquisition.

Each of or any combination of signals 410, 420, and 430 may be directed to an digital pattern generator of the present disclosure. The electron dose modulator may comprise a portion of an electron dose modulator. The electron dose modulator may comprise a field-programmable gate array. The electron dose modulator may form an electron dose waveform based on the electron signal or the electron induced signal. Signal 440 shows an example electron dose waveform of the present disclosure which may be directed to the deflector via the driver electronics. In some cases, each pixel or each detector or each portion of a detector may receive its own electron dose waveform. In some cases, each pixel or each detector or each portion of a detector may receive a different preprogrammed pulse duration. In some cases, each pixel or each detector or each portion of a detector may receive an on/off signal, a signal with a continuously variable temporal profile, or an arbitrary electron dose waveform which determines when it records or does not record signals.

In some cases, a controller of the present disclosure comprises a pattern generator configured to produce an electrical signal representative of the electron dose waveform and a driver electronics configured to receive the electrical signal from the pattern generator and supply a voltage comprising the electron dose waveform to the deflector. In some cases, a controller further comprises one or more computer processors comprising instructions that when executed are configured to receive an indication of the electron dose waveform and deliver the indication to the pattern generator. In some cases, a controller of the present disclosure is configured to determine a time to keep the electron signal on in response to the electron event signal.

In some cases, each pixel or each detector or each portion of a detector may receive an on/off signal, a signal with a continuously variable temporal profile, or an arbitrary electron dose waveform which determines when it records or does not record signals. In some cases, a continuously variable temporal profile is modulated in "real time." In some cases, real time comprises substantially within an electron counting interval of the detector.

The electron dose waveform may have an arbitrarily defined temporal profile. An arbitrarily defined electron dose profile may be a profile that is not dictated by a regularly periodic function. Regularly periodic functions may include pulse patterns or regular pulse patterns, e.g., square waves, sine waves, or regularly repeating pulses, and aperiodic functions may include ramp pules, Gaussians, Lorentzians, exponential rises, exponential decays, and haversines. An arbitrarily defined electron dose waveform may be an electron dose waveform which does not have a regular pulse width or does not have a regular repetition rate or both. An arbitrarily defined electron dose waveform may be an electron dose waveform which has a selectable non-regular pulse width or has a selectable non-regular repetition rate or both.

In some cases, an arbitrarily defined electron dose profile may comprise a dose profile with a series of points (e.g., waypoints). The waveform may be interpolated from the series of points. The series of waypoints are individually or collectively selectable to construct an arbitrarily defined temporal profile. In some cases, the arbitrarily defined temporal profile is indicated by a user. In some cases, a user may provide a function and a series of waypoints may be generated. In some cases, a user may individually move a waypoint or set of waypoints to change the waveform. In some cases, the electron dose waveform is aperiodic.

In some cases, the temporal profile comprises a temporal resolution. In some cases, the temporal resolution is defined as the distance between waypoints in the arbitrarily defined temporal profile. The temporal resolution may be less about than about 100 ns (nanoseconds). The temporal resolution may be less than about 50 ns. The temporal resolution may be less than about 10 ns. The temporal resolution may be optionally, less than about 100 ns, about 50 ns, about 20 ns, about 10 ns, about 5 ns, about 1 ns, about 500 ps (picoseconds), about 250 ps, about 100 ps, about 50 ps, about 20 ps, about 10 ps, about 5 ps, about 2 ps, about 1 ps, about 500 µs (microsecond), about 250 µs, about 100 µs, about 50 µs, about 20 µs, about 10 µs, or lower. Any of the lower and upper values described in this paragraph may be combined to form a range included within the present disclosure, for example, the temporal resolution may be within a range from about 100 ns to about 5 ns, from about 50 ns to about 1 ns, or from about 20 ns to about 1 ns.

In some cases, a series of waypoints comprises greater than about 1000 waypoints. In some cases, a series of waypoints comprises greater than about 10,000 waypoints. In some cases, the series of waypoints comprises greater than about 100,000 waypoints. In some cases, the series of waypoints comprises greater than about 1,000,000 waypoints or more. In some cases, the series of waypoints comprises between about 10,000 waypoints and about 1,000,000 waypoints. In some cases, the series of waypoints is repeated a number of times to form a series of series. In some cases, the series is repeated about 10 times, about 100 times, about 1,000 times, about 10,000, about 100,000 times, about 1,000,000 times or more. Any of the lower and upper values described in this paragraph may be combined to form a range included within the present disclosure, for example, the number of repetitions in a time series may be within a range from about 10 to about 10,000, from about 1 to about 100, or from about 1 to about 1,000.

In some cases, the waveform may comprise multiple pulses within a series. For example, the electron dose waveform may comprise a pump and a probe pulse. A pump-probe experiment may be used to measure time dependent processes within the sample. In some cases, a pump pulse and a probe pulse may have the same shape, e.g., two Gaussians, two Lorentzians, two square waves, etc. In some cases, the shape of the two pulses may be different, for example, an exponential decay and a Gaussian, or any two other pulse types described herein. The series of pulses may be repeated a number of times to form a series of series. In some cases, the series is repeated about 10 times, about 100 times, about 1,000 times, about 10,000, about 100,000 times, about 1,000,000 times or more. Any of the lower and upper values described in this paragraph may be combined to form a range included within the present disclosure, for example, the number of repetitions in a time series may be within a range from about 10 to about 10,000, from about 1 to about 100, or from about 1 to about 1,000.

In some cases, a repetition rate of the series of electron dose waveforms is greater than about 1 kHz, about 5 kHz, about 10 kHz, about 20 kHz, about 50 kHz, about 100 kHz, or more. In some cases, a repetition rate of the series of electron dose waveforms is less than about 1000 MHZ, about 500 MHz, about 200 MHz, about 100 MHz, or less. Any of the lower and upper values described in this paragraph may be combined to form a range included within the present disclosure, for example, a repetition rate of the series of electron dose waveforms may be from about 500 kHz to about 1 MHz, from about 100 kHz to about 10 MHz, or from about 10 kHz to about 100 MHz.

In some cases, a minimum repetition period of the series of electron dose waveforms may be optionally, less than about 100 ms (milliseconds), about 50 ms, about 20 ms, about 10 ms, about 5 ms, about 1 µs (microseconds), about 500 µs, about 250 µs, about 100 µs, about 50 µs, about 20 µs, about 10 µs, or lower. Any of the lower and upper values described in this paragraph may be combined to form a range included within the present disclosure, for example, the minimum repetition period may be within a range from about 1 ms to about 1 µs, from about 100 µs to about 1 µs, or from about 20 ns to about 1 µs.

The electron dose waveform may have a continuously variable temporal profile. For example, a user may determine a waveform and later may alter a waveform. An alteration may comprise changing a location of one or more waypoints, changing a time between repetitions of a series of waveforms, changing a number of repetitions, etc. In some cases, the width of pulses of a square wave may be changed dynamically. For example, a pulse width of a series of square waves may be aperiodic or have a continuously adjustable periodicity.

In some examples, the user may choose between an arbitrarily defined temporal profile and a regularly periodic function. For example, the deflector may provide pulse patterns or regular pulse patterns, e.g., square waves, sine waves, or TTL pulses, and may include regularly repeating pulses, ramp pulses, Gaussians, Lorentzians, exponential rises, exponential decays, and haversines, to the deflector. In some cases, the electron dose waveform is periodic.

In some cases, a transition between a high deflector voltage and a low deflector voltage may be characterized by a transition time. For example, a transition time between a high voltage and a low voltage is less than about 50 ns, defined as a sum of a ringing time plus a slope time. In some cases, a transition time between a high voltage and a low voltage is less than about 1 microsecond, about 500 ns, about 250 ns, about 100 ns, about 50 ns, about 20 ns, about 10 ns, about 5 ns, or less.

In some cases, a transition between a high deflector voltage and a low deflector voltage may be characterized by a transition time. For example, a transition time between a high voltage and a low voltage is less than about 10 ns, defined as a slope time from about 10% to about 90% a transition voltage. In some cases, a transition time between a high voltage and a low voltage is less than about 1 microsecond, about 500 ns, about 250 ns, about 100 ns, about 50 ns, about 20 ns, about 10 ns, about 5 ns, about 2 ns, about 1 ns or less.

In some cases, the electron dose waveform is characterized by a shortest exposure time. For example, the electron dose waveform may comprise a shortest exposure time of about 100 ns. In some cases, the shortest exposure time is less than about 1 microsecond, about 500 ns, about 250 ns, about 100 ns, about 50 ns, about 20 ns, about 10 ns, about 5 ns, about 2 ns, about 1 ns, or less. Any of the lower and upper values described in this paragraph may be combined to form a range included within the present disclosure, for example, the shortest exposure time may be within a range from about 500 ns to about 1 ns, about 100 ns to about 5 ns, from about 50 ns to about 1 ns, or from about 20 ns to about 1 ns.

In some cases, the temporal profile comprises a pulse width. The minimum pulse width may be less about than about 100 ns (nanoseconds). The minimum pulse width may be less than about 50 ns. The temporal resolution may be less than about 10 ns. The minimum pulse width may be optionally, less than about 100 ns, about 50 ns, about 20 ns, about 10 ns, about 5 ns, about 1 ns, about 500 μs (picoseconds), about 250 μs, about 100 μs, about 50 μs, about 20 μs, about 10 μs, or lower. Any of the lower and upper values described in this paragraph may be combined to form a range included within the present disclosure, for example, the minimum pulse width may be within a range from about 100 ns to about 5 ns, from about 50 ns to about 1 ns, or from about 20 ns to about 1 ns.

In some cases, the temporal profile comprises a fastest pulse duration. The fastest pulse duration may be less about than about 200 ns (nanoseconds). The fastest pulse duration may be less than about 100 ns. The temporal resolution may be less than about 50 ns. The fastest pulse duration may be optionally, less than about 100 ns, about 50 ns, about 20 ns, about 10 ns, about 5 ns, about 1 ns, about 500 μs (picoseconds), about 250 μs, about 100 μs, about 50 μs, about 20 μs, about 10 μs, or lower. Any of the lower and upper values described in this paragraph may be combined to form a range included within the present disclosure, for example, the fastest pulse duration may be within a range from about 100 ns to about 5 ns, from about 50 ns to about 1 ns, or from about 20 ns to about 1 ns.

In some examples, dose modulation may be implemented using a fast electrostatic shutter. The electron beam may be rapidly blanked at fixed repetition rate (kHz-MHz) such that the average dose is reduced. In this example, the peak dose rate may not change. When the average dose rate or repetition frequency is changed, the settings may take effect after a delay. In some cases, a delay may be a non-repeatable delay, a regularly repeatable delay, or an irregularly repeated delay.

A repetition rate of the electron dose waveform in a shutter mode may be within a range from about 500 kHz (kilohertz) to about 1 MHz (megahertz) at a voltage of the electron beam within a range from about 80 kV (kilovolts) to about 300 kV. A repetition rate may be within a range from about 10 kHz to about 100 MHz at a voltage of the electron beam within a range from about 80 kV to about 300 kV. A repetition rate may be within a range from about 500 kHz to about 1 MHz at a voltage of the electron beam within a range from about 0.5 kV to about 1,000 kV.

In some cases, a repetition rate of the electron dose waveform is greater than about 1 kHz, about 5 kHz, about 10 kHz, about 20 kHz, about 50 kHz, about 100 kHz, or more. In some cases, a repetition rate of the electron dose waveform is less than about 1000 MHZ, about 500 MHz, about 200 MHz, about 100 MHz, or less. Any of the lower and upper values described in this paragraph may be combined to form a range included within the present disclosure, for example, from about 500 kHz to about 1 MHz, from about 100 kHz to about 10 MHz, or from about 10 kHz to about 100 MHz.

A variable adjustor such as a knob, a lever, a slider, a dial, etc. may be connected to the digital pattern generator. A variable adjustor may be a physical or virtual knob to adjust the average intensity. In some cases, the average intensity is controllable independently of a driving voltage of the electron source. For example, the average intensity may comprise adjusting a time delay between electron pulses, narrowing of electron pulse duration, or a direct adjustment of the amplitude of the waveform.

In some cases, the average intensity is continuously variable across a range from 0 to 100% dose transmission or 0 to 100% dose attenuation. The dose attenuation (also referred to as the attenuation rate) may be expressed as a ratio a/b, where a is the pulse width and b is the period of the electron dose waveform. The dose attenuation may be expressed as a percentage. The dose transmission may be related to the dose attenuation by the relation: dose transmission=100%-dose attenuation expressed as a percentage.

In some cases, the average intensity is continuously variable across a range from 0 to 100% dose transmission or 0 to 100% dose attenuation in increments of about 30%, about 25%, about 20%, about 15%, about 10%, about 9%, about 8%, about 7%, about 6%, about 5%, about 4%, about 3%, about 2%, about 1%, about 0.5%, about 0.1%, about 0.05%, about 0.01%, about 0.001% or less.

Any of the lower and upper values described in this paragraph may be combined to form a range included within the present disclosure, for example, the dose attenuation may be varied in increments within a range from about 30% to about 0.01%, from about 10% to about 0.1%, from about 30% to about 1%, from about 10% to about 0.01%, etc.

The ratio (a/b) of the pulse width and the period may be varied over the time. For example, it may be varied over the course of 20 seconds. The ratio may be varied over a time less than about 100 s (seconds), about 50 s, about 20 s, about 10 s, about 5 s, about 1 s, about 500 ms, about 250 ms, about 100 ms, about 50 ms, about 20 ms, about 10 ms, or less. Any of the lower and upper values described in this paragraph may be combined to form a range included within the present disclosure, for example, the ratio may be varied over time within a range from about 100 s to about 1 ms, from about 100 s to about 1 s, or from about 50 s to about 1 s, etc.

The combination of the event signal processor and the digit pattern generator may enable the device to detect one (or more) electron events and then switch the electron beam with very precise control (of the order of 10 nanoseconds). When enough events have been captured to determine the scattering rate at a given pixel, the beam can be blanked for the remainder of the time. This might be after one event, or after some larger number.

Information Efficiency

As disclosed herein, there may be a diminishing return for information-content for each additional electron successively striking the sample within a single pixel or portion of a detector. To illustrate the principle, a simple Bayesian model was constructed with an electron detection probability p (ranging from 0 to 1) and a system that counts the arrival time t of the nth electron to reach the detector. For convenience, the time t is expressed with respect to the electron beam current such that, on average, one electron arrives per unit of time. For the purposes of this example, it is supposed that the value of p is maximally unknown (in the example, uniformly distributed from 0 to 1; this is the a priori probability distribution) before the measurement. It was investigated how much may be learned about the value of p by measuring the arrival time t. The statistical distribution of this arrival time may be calculated using the mathematical theory of a Poisson process, yielding a likelihood function that determines the a posteriori distribution of p after the measurement according to Bayes' theorem.

Figure 5:
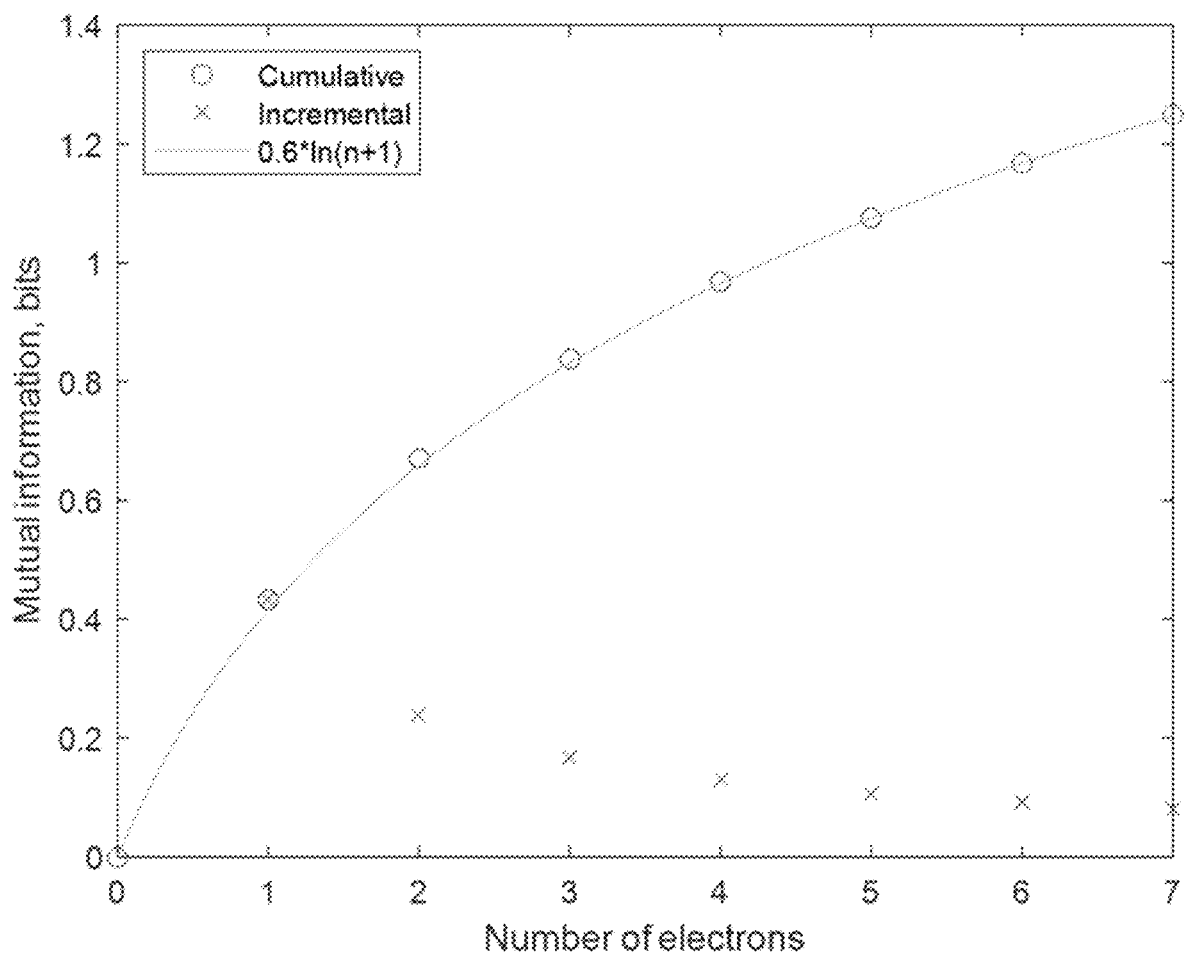
FIG. 5 shows a representation of the cumulative and incremental mutual information for successive electron detection events.

FIG. 5 shows a representation of the cumulative and incremental mutual information for successive electron detection events. The information gained about the value of p may be quantified using an information-theoretical concept called "mutual information," which may be expressed in units of bits. The mutual information is a measure of how much is learned about the sample, on average, by virtue of doing the measurement. Mutual information is calculated as the difference between the a priori and expected a posteriori differential entropies for the probability distributions over the variable p. This model yields the graph shown in FIG. 5.

As shown, at the left-hand side of the graph, when 0 electrons are detected (e.g., before performing the measurement), the mutual information is 0; nothing is learned about the material. The arrival time of the first electron yields approximately 0.43 bits of information on average. If it arrives in a short amount of time, it is suggested that p is probably large, and conversely if it takes a long time to arrive, it is suggested that p is probably small. This intuition is expressed quantitatively by the a posteriori probability distribution of p. As more electrons are counted, more and more information is gained, allowing the value of p to be determined to greater and greater precision. This is shown in the "cumulative" (circles) points in the graph. So, after measuring 2 electrons, on average a total of 0.67 bits of information are learned about the sample, after measuring 3 electrons 0.84 bits are learned, etc. This curve exhibits approximately logarithmic diminishing returns (smooth curve in the graph). While each electron gives more information than before, the increment is steadily diminishing (X points in the graph). So, the second electron provided 0.67-0.43=0.24 bits of information that was not already obtained from detecting the first electron, and the third electron provided an additional 0.17 bits, etc. This diminishing return of information is generic across a wide range of similar models. Assuming prior knowledge about p, for example, shifts the curves in both x and y but does not change the basic behavior.

This logarithmic dependence means that the first electron yields roughly as much information as the second and third electrons combined, or electrons 4-7 combined, or the following 8, etc. By contrast, the probability of beam-induced sample damage is at least constant for each incoming electron—potentially even increasing with accumulating dose where multi-excitement events or heat build-up occurs. So, as the electron source keeps hitting the same pixel with electrons, the experimenter incrementally learns less and less while potentially damaging the sample more and more.

Information Efficient Electron Detection

The present disclosure provides methods and system for information-efficient electron detection. For example, the present disclosure provides methods for measuring an electron signal or an electron induced signal. In an example, one can set a maximum number n of electrons to be counted in one dwell time and blank the beam after that. The arrival time of electron number n (or the number of detected electrons if fewer than n arrive during the dwell time) then allows an estimate the most likely value of p for that pixel. The parameter n may be selected based on the amount of information per pixel required for a specific application. Once the information up to a threshold is obtained, one can stop irradiating the sample and allow it some time to cool, for charge to dissipate, or to somehow relax before stepping otherwise to the next pixel position and repeating the process. Coupling an electron dose modulator with an electron event counter of the present disclosure may be advantageous in accomplishing methods described herein.

Without being limited by theory, the achievable relative irradiation saving may depend on several further factors including dwell-time, the sample scattering rate (e.g., mass thickness in the case of ADF, though different mechanisms are relevant for different kinds of detectors), the detector's collection efficiency, the timing precision of the event detection, the pixel-to-pixel variation of the scattering rate, and the response speed of the beam-blanker.

FIG. 6 shows an example method 600 of the present disclosure. Method 600 may comprise an example of a method for measuring an electron signal or an electron induced signal.

At an operation 610 of the method 600, the method may comprise providing a threshold number of events or a threshold event rate for a pixel on a detector. In some cases, a threshold number of events may be a number of events at a single pixel. In some cases, a threshold number of events may be an average or sum of events over many pixels. In some cases, an event is an electron impact. An event may be a single count on an electron detector. In some cases, a signal at the detector is an electron signal or an electron induced signal from a sample. In some cases, determining that a count has been achieved may be determined use of an event signal processor as disclosed herein with respect to the section "Event Signal Processor."

A threshold may be determined by various techniques. For example, a threshold may be based on a damage threshold for a sample. A threshold may be determined based on the information gain for a pixel being less than a threshold. The threshold may be determined by experiment. The threshold may be set by a user. The threshold may be varied by the user. The threshold may be set with input from models of information efficiency. In some cases, the threshold number of events or the threshold event rate is determined based on information about the sample. Further description of thresholding techniques any of which may be used in combination with method 600 is disclosed herein with respect to the sub-sections "Complex Thresholding" or "Algorithmic Thresholding."

At an operation 620 of the method 600, the method may comprise collecting from the detector the threshold number of events or determining that the threshold event rate is achieved. The collecting may comprise use of a detector of the present disclosure, for example, detector 104. In some cases, a signal from an event signal processor may be delivered to a controller of the present disclosure. The controller may take the event counting signal and determine that a threshold is achieved.

At an operation 630 of the method 600, the method may comprise modulating an intensity of an electron source directed to the sample in response to the collecting in 620. In some cases, the signal from the event signal processor may be conveyed to a controller comprising a driver electronics 120 and a digital pattern generator 130. In some cases, operation 630 comprises use of a deflector. For example, the digital pattern generator may control a deflector which switches an electron source according to a pattern of the pattern generator. The pattern generator may be a low voltage signal which may be conveyed to a driver electronics. In some cases, operation 630 comprises moving the electron source to another position on the sample. In some cases, operation 630 comprises turning the electron source off.

The driver electronics may take the low voltage signal and convert it to a high voltage signal which may be used to apply the high voltage to the plate to deflect the electron beam. A sequence generator 140 of the present disclosure may comprise a circuit or a set of digital instructions on the controller which determine a waveform of the signal to be generated at the pattern generator. As disclosed herein, the waveform may be arbitrary electron dose waveform. In some cases, operation 630 is performed in substantially "real time." For example, real time may comprise a time substantially within an electron counting interval of the detector. Real time can refer to a response time of less than about 1 microsecond, a tenth of a microsecond, a hundredth of a microsecond, a nanosecond, a tenth of a nanosecond, a hundredth of a nanosecond, a picosecond, or less.

In some cases, operation 630 comprises modulating an electron dose waveform, wherein the electron does waveform is continuously updated based on a number of events determined from the signal. The electron dose waveform may comprise a continuously temporal variable profile. In some cases, the electron dose waveform comprises an arbitrarily defined temporal profile. For example, the arbitrarily defined temporal profile may comprise a temporal resolution of less than 10 ns.

In some cases, the electron dose waveform comprises a series of waypoints. In some cases, the series of waypoints are individually or collectively selectable to construct the arbitrarily defined temporal profile. In some cases, the series comprises greater than 1000 waypoints. In some cases, method 600 further comprises receiving an indication of the arbitrarily defined temporal profile from a user.

For illustrative purposes, the methods of the present disclosure are compared to compressive sensing (CS). An example of CS methods is presented in: L. Kovarik, A. Stevens, A. Liyu, and N. D. Browning, *Implementing an Accurate and Rapid Sparse Sampling Approach for Low-Dose Atomic Resolution STEM Imaging*, Appl. Phys. Lett. 109, 164102 (2016) and A. Stevens, L. Kovarik, P. Abellan, X. Yuan, L. Carin, and N. D. Browning, *Applying Compressive Sensing to TEM Video: A Substantial Frame Rate Increase on Any Camera*, Adv. Struct. Chem. Imaging 1, 10 (2015), each of which is incorporated by reference in their entireties.

Briefly, compressive sensing may be an undersampling/inpainting approach. In this form of CS, the beam may be scanned in a sparse way meaning that a fraction of the pixels is irradiated. This fraction can be as low as 10% or lower, but within each pixel a large electron dose is used. This may have some small advantages if analog Gaussian read-out noise dominates in the system (say from low quality electronics), or if the main goal is video framerate and not precision. See, for example, Sanders, et al., *Inpainting vs denoising for dose reduction in scanning-beam microscopies*. IEEE Transactions on Image Processing, Vol. 29, pp. 351-359 (2020), which is incorporated by reference in its entirety.

However, with digital STEM detector read-out approaches, Gaussian read-out noise may be substantially reduced. Accordingly, compressed sensing may offer no more information content. Further, based on the diminishing returns of information discussed earlier, CS may, in some cases, generally fare even worse than a non-CS scan with the same total dose in terms of information return per electron.

The methods and systems disclosed herein may improve upon the dose reduction approach in CS because, in the instant method, timing data may be exploited to determine scattering rate early in the pixel dwell time and the beam may be shut off for the reminder of the duty cycle. By contrast, in CS, a fraction of the pixels may be illuminated, in some cases, as low as 10%, while no information is obtained from the unilluminated pixels at all. The methods and systems disclosed herein may improve upon existing methods because dose can be tailored to every pixel to optimize information efficiency. The methods and systems disclosed herein may improve upon existing methods at least because the frame rate may be increased if the trigger signal is used to skip ahead to next pixel when enough counts are collected. The methods and systems disclosed herein may improve upon existing methods at least because the image may be rendered live (without waiting for a full image raster to be completed), which CS is not able to do. By comparison to CS, the present disclosure is compatible with row-based non-rigid registration (e.g., SmartAlign), for example, as described in L. Jones, H. Yang, T. J. Pennycook, M. S. J. Marshall, S. Van Aert, N. D. Browning, M. R. Castell, and P. D. Nellist, *Smart Align-a New Tool for Robust Non-Rigid Registration of Scanning Microscope Data*, Adv. Struct. Chem. Imaging 1, 8 (2015), which is incorporated by reference herein for all purposes. By comparison to CS, the present disclosure is robust to artifacts. By comparison to CS, the present disclosure is compatible with line interlacing or line flyback-hysteresis correction, for example, as described in T. Mullarkey, J. J. P. Peters, C. Downing, and L. Jones, *Using Your Beam Efficiently: Reducing Electron Dose in the STEM via Flyback Compensation*, Microsc. Microanal. 28, 1428 (2022), which is incorporated by reference herein in its entirety. By comparison to CS, the present disclosure is compatible with STEM Moire imaging, for example, as disclosed in S. Kim, Y. Kondo, K. Lee, G. Byun, J. Jung Kim, S. Lee, and K. Lee, *Quantitative Measurement of Strain Field in Strained-Channel-Transistor Arrays by Scanning Moiré Fringe Imaging*, Appl. Phys. Lett. 103, 033523 (2013), which is incorporated by reference herein in its entirety. By comparison to CS, the present disclosure is compatible with fully spatially sampled event-based EELS, for example, as disclosed in Y. Auad, M. Walls, J.-D. Blazit, O. Stephan, H. G. Tizei, M. Kociak, F. De La Peña, and M. Tencé, *Event-Based Hyperspectral EELS: Towards Nanosecond Temporal Resolution*, (n.d.), which is incorporated by reference herein in its entirety.

Drift Correction & Non-rigid Registration—Drift correction and non-rigid registration may be used in high-resolution STEM imaging applications. However, these techniques may generally rely on a simple one-to-one correspondence between pixel-coordinate and pixel-time. The algorithms generally assume that images are densely sampled, with information in every pixel. Strategies that implement compressed sensing (either by pixel jumping or row-hopping) however break this relationship, as most of the pixels in the image are never sampled. This means that many highly-performing registration algorithms are not available. While the missing pixels can be inpainted based on probabilistic models and nearby information, this takes time and may lack the fully-resolved spatial information of a densely-sampled image. Devices and methods disclosed herein may be able to retain a Shannon scanned raster and facilitates, for example, affine transformation of the data because of this.

Complex Thresholding—In an example approach to determining the blanking threshold, the signal at one detector or segment can be designated the "driver," and the others as "driven." The channel which is the driver may be used for the event counting used to trigger the blanking of the beam, and one or more additional channels (for example, either or both of driving and driven) May be logged for electron events up until this time. In some cases, the detection channel used for the driving segment may be the one expected to have the weakest scattering rate. A segment with a lower scattering rate may be the highest angle of any installed dark-field rings, or the smallest of any segmented areas. Although selecting the channel with the lowest scattering collection efficiency may be expected to then receive the fewest electron events, because of the statistical nature of electron scattering other channels may receive more or fewer events during the pixel beam-on duration.

In some cases, the same channel may be used as the driving one throughout the entire image frame (field-of-view); however, in some cases, the driving channel may be used at different times during acquisition. For example, in the case of geometrically equivalent detectors, such as a four-quadrant differential phase contrast (DPC) geometry, four equally sized quadrants are commonly used to detect the DPC signal; in this case one may have the driving channel be whichever of these four reaches the event threshold first.

Example, DPC geometry methods are disclosed for example at K. Müller, F. F. Krause, A. Beche, M. Schowalter, V. Galioit, S. Löffler, J. Verbeeck, J. Zweck, P. Schattschneider, A. Rosenauer, K. Müller-Caspary, F. F. Krause, A. Béché, M. Schowalter, V. Galioit, S. Löffler, J. Verbeeck, J. Zweck, P. Schattschneider, and A. Rosenauer, *Atomic Electric Fields Revealed by a Quantum Mechanical Approach to Electron Picodiffraction*, Nat. Commun. 5, 1 (2014) and N. H. Dekkers and H. de Lang, *Differential Phase Contrast in a STEM*, Optik (Stuttg). 41, 452 (1974), each of which is incorporated herein by reference in their entirety.

Another example approach to determining the blanking threshold may be based on the sum of the total electron counts in all detector segments (or some predetermined subset). In the theoretical limit of 100% quantum efficiency (with substantially all electrons impinging on the sample being counted in some detector), this counting method may have the effect of eliminating pixel-to-pixel fluctuations in the incident electron beam current. These fluctuations may arise from at least two distinct sources. The first is instabilities in the electron source. Some kinds of electron guns are subject to small current fluctuations on the scale of microseconds, milliseconds, or longer. The second is from the statistical nature of particle beams in the form of Poisson noise (also called "counting statistics" or "shot noise"), such that if N electrons impinge the sample on average during each dwell time, there is a (usually) inevitable statistical fluctuation of $\pm\sqrt{N}$ in each pixel. Many STEMs include noise reduction features whereby a sample of the beam current is measured during the scan, and this signal (after rather aggressive low-pass filtering) is used to digitally adjust the image to compensate for the variation in electron illumination intensity. If substantially all electrons that strike the sample in one dwell time are counted, either directly or through an integrated current measurement, and the source is blanked after some specified count n, both kinds of noise may be eliminated on a single-pixel basis.

In another example of determining the blanking threshold, the methods of the present disclosure may be extended to pixelated STEM. In pixelated STEM, a two-dimensional camera is positioned in the detection chamber and a diffraction image is read out at every probe position (yielding four-dimensional data). An additional description of pixelated STEM may be found, for example, at C. Ophus, *Four-Dimensional Scanning Transmission Electron Microscopy (4D-STEM): From Scanning Nanodiffraction to Ptychography and beyond Basics of 4D-STEM*, Microsc. Microanal. 1 (2019), which is incorporated by reference in its entirety.

In some cases, the controller may be configured to blank the primary beam when either any one pixel has reached the event threshold, when some number/proportion of the pixels reach this threshold, or when the summed event number across the detector reaches some threshold. Beyond pixelated stem, this approach may be applied to other techniques such as event-driven binary-ptychography. An additional description of event-driven binary-ptychography can be found at, for example, E. Hedley, B. Eckert, H. Soltau, and P. D. Nellist, *Fast Ptychographic Reconstruction for Sparse Binary Ptychography Data*, Microsc. Microanal. 28, 438 (2022), which is incorporated by reference in its entirety.

Similarly, where pixelated arrays are used for center-of-mass type imaging (COM), the beam may be blanked when enough electron detection events have been recorded to identify the center-of-mass vector to some predetermined acceptable angular-precision limit.

Algorithmic Thresholding—In some cases, custom blanking threshold functions may be tailored to an application. For example, these functions may be guided by empirical studies of specific types of samples. The functions may be implemented by firmware designed to be guided by empirical data. For example, if a user imaging a complex structure containing more than one material, some of the materials in the image may be more interesting than others to the user, and some may be more radiation-sensitive than others.

Figure 7:
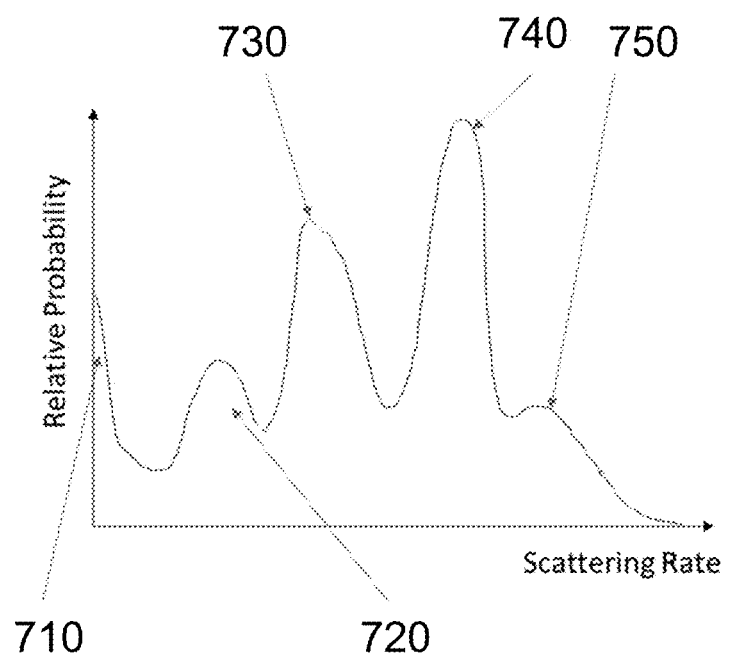
FIG. 7 shows a histogram of ADF signal rate per pixel (relative probability) as a function of the scattering rate for an example sample.

FIG. 7 shows a hypothetical histogram of ADF signal rate per pixel (relative probability) as a function of the scattering rate for an example sample. For example, suppose a user is more interested in the low-atomic number elements for a sample with the characteristics of FIG. 7. A scattering rate peak near zero 710 may comprise a nearly transparent portion. Signal from this area may generally not be of interest but irradiating such a region may still cause damage through delocalized energy deposition, as is common in inelastic electron scattering. Peak 720 may be indicative of low atomic number elements, and in this hypothetical example may be interesting to a user. Peak 730 may be indicative of intermediate elements. This may be a more radiation sensitive component that, in the example, the user may not be interested in. Peaks 740 and 750 may be indicative of heavy scattering elements. There may be a lot of signal from these elements and they may be easy to recognize because of the high signal. However, because of the high scattering probability these peaks may allow for high energy deposition into the sample.

In the example, the user may like to know the locations of the heavy elements, but they may be recognized with very little beam-on time per pixel. Further, if the beam is on any intermediate elements, then the beam may be striking, for example, a highly beam-sensitive insulator, or a region of the sample that the user is not interested in.

In such a case, from the arrival times of the first few electrons to reach the detector, a user may have at least moderate confidence as to which peak in the histogram, they are likely sampling in the current pixel. They may like to shut off the beam relatively early if they are in the "empty space" 710 or "heavy elements" 740, 750 regions and very early if they are in the "intermediate elements" region 730, while leaving the beam on for 100% of the dwell time in the "low-atomic-number elements" region 720.

A set of rules or instructions based on various information thresholds may be developed based on the information to be collected. For example, continuing with the example of FIG.

7, in order to improve the information-to-damage ratio for the data acquisition, a set of rules like the following may be established:

- If there are 2 or fewer events in the first half of the dwell time, shut off the beam at the halfway point. This is likely empty space.
- If there are 100 or more events in a single dwell time, shut off the beam when the system has counted 100 events. This are probably heavy elements, and most of the available information from this pixel is likely already obtained.
- If there are between 3 and 5 events in the first 10% of the dwell time, shut off the beam immediately. There is a strong probability that the beam is striking the radiation-sensitive intermediate-density material.
- Otherwise, leave the beam on for the entire dwell time and count the total signal.

In some cases, these rules may be implemented in a sequence generation algorithm that may both blank the beam at the appropriate time and report out the electron detection rate (number of detected electrons divided by the beam-on time), for each pixel, over either analog or digital signals that may be automatically recorded by the microscope's scan control unit. This may produce a directly interpretable image.

Information efficient imaging based on an event threshold or threshold rate—The method 600 disclosed herein may generally be extended to electron imaging. For example, method 600 may further comprise forming an image in response to the modulated electron signal at the detector. In some cases, rather than recording a time to reach a threshold, an imaging method of the present disclosure may comprise counting a number of events.

FIG. 8 shows an example method 800 of the present disclosure. Method 800 may comprise an example of a method of forming an image based an electron event signal.

At an operation 810 of the method 800, the method may comprise providing an information threshold for a sample. In some cases, a threshold number of events may be a number of events at a single pixel. In some cases, a threshold number of events may be an average or sum of events over many pixels. In some cases, an event is an electron impact. An event may be a single count on an electron detector. In some cases, a signal at the detector is an electron signal or an electron induced signal from a sample. In some cases, determining that a count has been achieved may be determined use of an event signal processor as disclosed herein with respect to the section "Event Signal Processor."

A threshold may be determined by various techniques. For example, a threshold may be based on a damage threshold for a sample. A threshold may be determined based on the information gain for a pixel being less than a threshold. The threshold may be determined by experiment. The threshold may be set by a user. The threshold may be varied by the user. The threshold may be set with input from model of information efficiency. In some cases, the threshold number of events or the threshold event rate is determined based on information about the sample. A threshold may be determined by a method as described in the sub-sections "Complex Thresholding" and/or "Algorithmic Thresholding."

At an operation 820 of the method 800, the method may comprise collecting from a detector a number of events equal to the information threshold or determining that an event rate equal to the information threshold is achieved. In some cases, a signal at the detector is an electron signal or an electron induced signal from a sample.

In some cases, method 800 may further comprise collecting from the detector the threshold number of events or determining that the threshold event rate is achieved. In some cases, a signal at the detector may be an electron signal or an electron induced signal from a sample.

At an operation 830 of the method 800, the method may comprise collecting forming an image. The operation of forming an image may comprise forming an image according to the electron signal or the electron induced signa. For example, the method may comprise forming an image according to the time to achieve the threshold number of events or the threshold event rate for a plurality of pixels. In some cases, a signal at the detector is an electron signal or an electron induced signal from a sample. For example, the electron signal or the electron induced signal may be a single electron signal.

In some cases, method 800 may further comprise modulating an intensity of an electron source directed to the sample in response determining that a threshold is achieved. In some cases, the signal from the event signal processor may be conveyed to a controller comprising a driver electronics 120 and a digital pattern generator 130. In some cases, the modulating comprises use of a deflector. For example, the digital pattern generator may control a deflector which switches an electron source according to a pattern of the pattern generator. The pattern generator may be a low voltage signal which may be conveyed to a driver electronics. In some cases, the modulating comprises moving the electron source to another position on the sample. In some cases, the modulating comprises turning the electron source off.

The driver electronics may take the low voltage signal and convert it to a high voltage signal which may be used to apply the high voltage to the plate to deflect the electron beam. A sequence generator 140 of the present disclosure may comprise a circuit or a set of digital instructions on the controller which determine a waveform of the signal to be generated at the pattern generator. As disclosed herein, the waveform may be arbitrary electron dose waveform. In some cases, the modulating is performed in substantially "real time." For example, real time may comprise a time substantially within an electron counting interval of the detector. Real time can refer to a response time of less than about 1 microsecond, a tenth of a microsecond, a hundredth of a microsecond, a nanosecond, a tenth of a nanosecond, a hundredth of a nanosecond, a picosecond, or less.

In some cases, the modulating comprises modulating an electron dose waveform, wherein the electron does waveform is continuously updated based on a number of events determined from the signal. The electron dose waveform may comprise a continuously temporal variable profile. In some cases, the electron dose waveform comprises an arbitrarily defined temporal profile. For example, the arbitrarily defined temporal profile may comprise a temporal resolution of less than 10 ns.

In some cases, the electron dose waveform comprises a series of waypoints. In some cases, the series of waypoints are individually or collectively selectable to construct the arbitrarily defined temporal profile. In some cases, the series comprises greater than 1000 waypoints. In some cases, method 800 further comprises receiving an indication of the arbitrarily defined temporal profile from a user.

Information Efficient Imaging Based on Time to Reach a Threshold

Figure 9:
FIG. 9 shows another example method of forming an image based an electron event signal.

FIG. 9 shows an example method 900 of the present disclosure. Method 900 may comprise an example of a method of forming an image based an electron event signal.

For example, the approach disclosed herein may be extended to multiple detectors (or detectors comprising multiple segments).

At an operation 910 of the method 900, the method may comprise providing a threshold number of events or a threshold event rate for a first pixel on a detector. In some cases, a threshold number of events may be a number of events at a single pixel. In some cases, a threshold number of events may be an average or sum of events over many pixels. In some cases, an event is an electron impact. An event may be a single count on an electron detector. In some cases, a signal at the detector is an electron signal or an electron induced signal from a sample. In some cases, determining that a count has been achieved may be determined use of an event signal processor as disclosed herein with respect to the section "Event Signal Processor."

A threshold may be determined by various techniques. For example, a threshold may be based on a damage threshold for a sample. A threshold may be determined based on the information gain for a pixel being less than a threshold. The threshold may be determined by experiment. The threshold may be set by a user. The threshold may be varied by the user. The threshold may be set with input from model of information efficiency. In some cases, the threshold number of events or the threshold event rate is determined based on information about the sample. A threshold may be determined by a method as described in the sub-section "Complex Thresholding." For example, in the case of the example algorithm in the sub-section "Complex Thresholding," an image comprising an intensity map of time to reach the threshold as a function of sample X and Y position may effectively form a map of the type of element present in the sample.

At an operation 920 of the method 900, the method may comprise recording a time to achieve the threshold number of events or the threshold event rate at a second pixel. In some cases, the second pixel is the pixel. In some cases, the second pixel is another pixel.

In some cases, method 900 may further comprise collecting from the detector the threshold number of events or determining that the threshold event rate is achieved. In some cases, a signal at the detector may be an electron signal or an electron induced signal from a sample. In some cases, method 900 may further comprise forming an image according to the time to achieve the threshold number of events or the threshold event rate for a plurality of pixels. In some cases, a signal at the detector is an electron signal or an electron induced signal from a sample. For example, the electron signal or the electron induced signal may be a single electron signal.

In some cases, method 900 may further comprise modulating an intensity of an electron source directed to the sample in response determining that a threshold is achieved. In some cases, the signal from the event signal processor may be conveyed to a controller comprising a driver electronics 120 and a digital pattern generator 130. In some cases, the modulating comprises use of a deflector. For example, the digital pattern generator may control a deflector which switches an electron source according to a pattern of the pattern generator. The pattern generator may be a low voltage signal which may be conveyed to a driver electronics. In some cases, the modulating comprises moving the electron source to another position on the sample. In some cases, the modulating comprises turning the electron source off.

The driver electronics may take the low voltage signal and convert it to a high voltage signal which may be used to apply the high voltage to the plate to deflect the electron beam. A sequence generator 140 of the present disclosure may comprise a circuit or a set of digital instructions on the controller which determine a waveform of the signal to be generated at the pattern generator. As disclosed herein, the waveform may be arbitrary electron dose waveform. In some cases, the modulating is performed in substantially "real time." For example, real time may comprise a time substantially within an electron counting interval of the detector. Real time can refer to a response time of less than about 1 microsecond, a tenth of a microsecond, a hundredth of a microsecond, a nanosecond, a tenth of a nanosecond, a hundredth of a nanosecond, a picosecond, or less.

In some cases, the modulating comprises modulating an electron dose waveform, wherein the electron does waveform is continuously updated based on a number of events determined from the signal. The electron dose waveform may comprise a continuously temporal variable profile. In some cases, the electron dose waveform comprises an arbitrarily defined temporal profile. For example, the arbitrarily defined temporal profile may comprise a temporal resolution of less than 10 ns.

In some cases, the electron dose waveform comprises a series of waypoints. In some cases, the series of waypoints are individually or collectively selectable to construct the arbitrarily defined temporal profile. In some cases, the series comprises greater than 1000 waypoints. In some cases, method 900 further comprises receiving an indication of the arbitrarily defined temporal profile from a user.

Using An Information Efficient Electron Imaging System—FIG. 10 shows an example method 1000 of the present disclosure. Method 1000 may comprise an example of a method for measuring an electron signal or an electron induced signal.

At an operation 1010 of the method 1000, the method may comprise providing a pattern generator configured to produce an electrical signal representative of an electron dose waveform having a continuously variable temporal profile. The pattern generator may comprise electron dose modulator 170. The pattern generator may comprise the electron dose modulator described herein with respect to the section "Electron Dose Modulator."

At an operation 1020 of the method 1000, the method may comprise providing an event signal processor configured to receive an electron signal or an electron-induced signal from a detector and, in response, determine a number of electron events on the detector based on a rising edge of the electron signal or the electron-induced signal at the detector, wherein the event signal processor comprises single event resolution. The event signal processor 150. The pattern generator may comprise the event signal processor described herein with respect to the section "Event Signal Processor."

In some cases, method 1000 further comprises modulating the electron dose waveform based on the number of electron events. In some cases, method 1000 further comprises performing any version of the methods 600, 800, or 900 as disclosed herein.

Applications

Spectroscopy—Devices and methods disclosed herein may be used in spectroscopic applications. For example, a STEM may have equipped one or more spectrometers. The one or more spectrometers may comprise an energy dispersive x-ray spectrometer (EDX), electron energy loss spectrometer (EELS), etc. In various spectroscopic applications, including without limitation EDX and EELS, the spectral data collected may be integrated within the pixel dwell time and assembled into a three-dimensional data cube (e.g., two spatial dimensions and one energy dimension). In combination with the devices and methods of the present disclosure, the illuminated duration of each pixel may be varied on a pixel-by-pixel basis. For example, in event streamed EELS spectroscopy, the electron dose modulation techniques disclosed herein may be unified with event stream accounting. For illustrative purposes, an example of event streamed EELS is disclosed, for example, in Y. Auad, M. Walls, J.-D. Blazit, O. Stéphan, H. G. Tizei, M. Kociak, F. De La Peña, and M. Tencé, Event-Based Hyperspectral EELS: Towards Nanosecond Temporal Resolution, (n.d.).

Damage Mechanisms—Devices and methods disclosed herein may be used to understand damage mechanisms. In some cases, an electron striking some detector segment or set of segments (e.g., in pixelated STEM) is correlated with some damage mechanism. It may be advantageous to avoid such a damage mechanism. In response, electrons hitting detector higher in the determination of the electron-count blanking threshold may comprise a weight. The correlation may be either direct or indirect. For example, it may be that electrons striking atoms of high atomic number are more likely to be subject to both high-angle scattering events and the deposition of large amounts of energy into the material (which can lead to various forms of sample damage). For example, high-angle scattering events may be detected using a high-angle annular dark field (HAADF) detector, while the deposition of energy may be detected spectroscopically. Either type of detector may be used for setting the threshold for blanking the beam. In a scan of a material with a mix of high and low atomic numbers, it may be challenging to image both the heavy and light elements without introducing unacceptable amounts of radiation damage. For example, if the beam current is high enough to image the light elements, the total energy absorption may be excessive, and the sample may take damage. The proposed system may automatically reduce the irradiation of the heavy elements that are both easy to see (e.g., not needing as much irradiation for adequate signal capture) and more prone to scatter and absorb energy from a large number of electrons. This strategy may reduce energy deposition into the sample without losing much in terms of information gained about the sample as the fast-arriving detected electrons will quickly go into the diminishing-returns regime. Conversely, this approach may automatically increase the exposure time for regions of lower atomic number. Dim, low-contrast regions that are otherwise hard to image may become much more accessible through this technique. The ability to see light elements in such materials has long been a major challenge in electron microscopy.

As an example, one may use an ADF or HAADF detector with a low counting threshold n to blank the beam while performing what a "low-loss electron energy loss spectrum image" of a nanostructured material suspended in empty space. Here, one may use a higher beam current (e.g., the full beam current) when the electron beam is not striking the sample at all, thus imaging surface electromagnetic excitations using the so-called "aloof EELS" method. Conversely, one may use a lower beam current (e.g., the beam may be very nearly shut off) as soon as it strikes the material itself. Using the algorithmic thresholding approach disclosed herein this adjustment may occur automatically, pixel-by-pixel, during the scan even if the sample was moving/drifting substantially during the measurement.

For illustrative purposes, an example of an "aloof EELS" method is provided, for example, at P. Rez, T. Aoki, K. March, D. Gur, O. L. Krivanek, N. Dellby, T. C. Lovejoy, S. G. Wolf, and H. Cohen, *Damage-Free Vibrational Spectroscopy of Biological Materials in the Electron Microscope*, Nat. Commun. 2016 71 7, 1 (2016) and P. A. Crozier, *Vibrational and Valence Aloof Beam EELS: A Potential Tool for Nondestructive Characterization of Nanoparticle Surfaces*, Ultramicroscopy 180, 104 (2017), each or which is incorporated herein by reference in its entirety.

For illustrative purposes, examples of drift correction are provided, for example, at L. Jones and P. D. Nellist, *Identifying and Correcting Scan Noise and Drift in the Scanning Transmission Electron Microscope*, Microsc. Microanal. 19, 1050 (2013); X. Sang and J. M. LeBeau, *Revolving Scanning Transmission Electron Microscopy: Correcting Sample Drift Distortion without Prior Knowledge*, Ultramicroscopy 138, 28 (2014), each of which is incorporated herein by reference in its entirety.

For illustrative purposes, examples of non-rigid registration are provided, for example, at B. Berkels, P. Binev, D. A. Blom, W. Dahmen, R. C. Sharpley, and T. Vogt, *Optimized Imaging Using Non-Rigid Registration*, Ultramicroscopy 138, 46 (2014) and L. Jones, H. Yang, T. J. Pennycook, M. S. J. Marshall, S. Van Aert, N. D. Browning, M. R. Castell, and P. D. Nellist, *Smart Align a New Tool for Robust Non-Rigid Registration of Scanning Microscope Data*, Adv. Struct. Chem. Imaging 1, 8 (2015), each of which is incorporated herein by reference in its entirety.

Computer Systems

Figure 11:
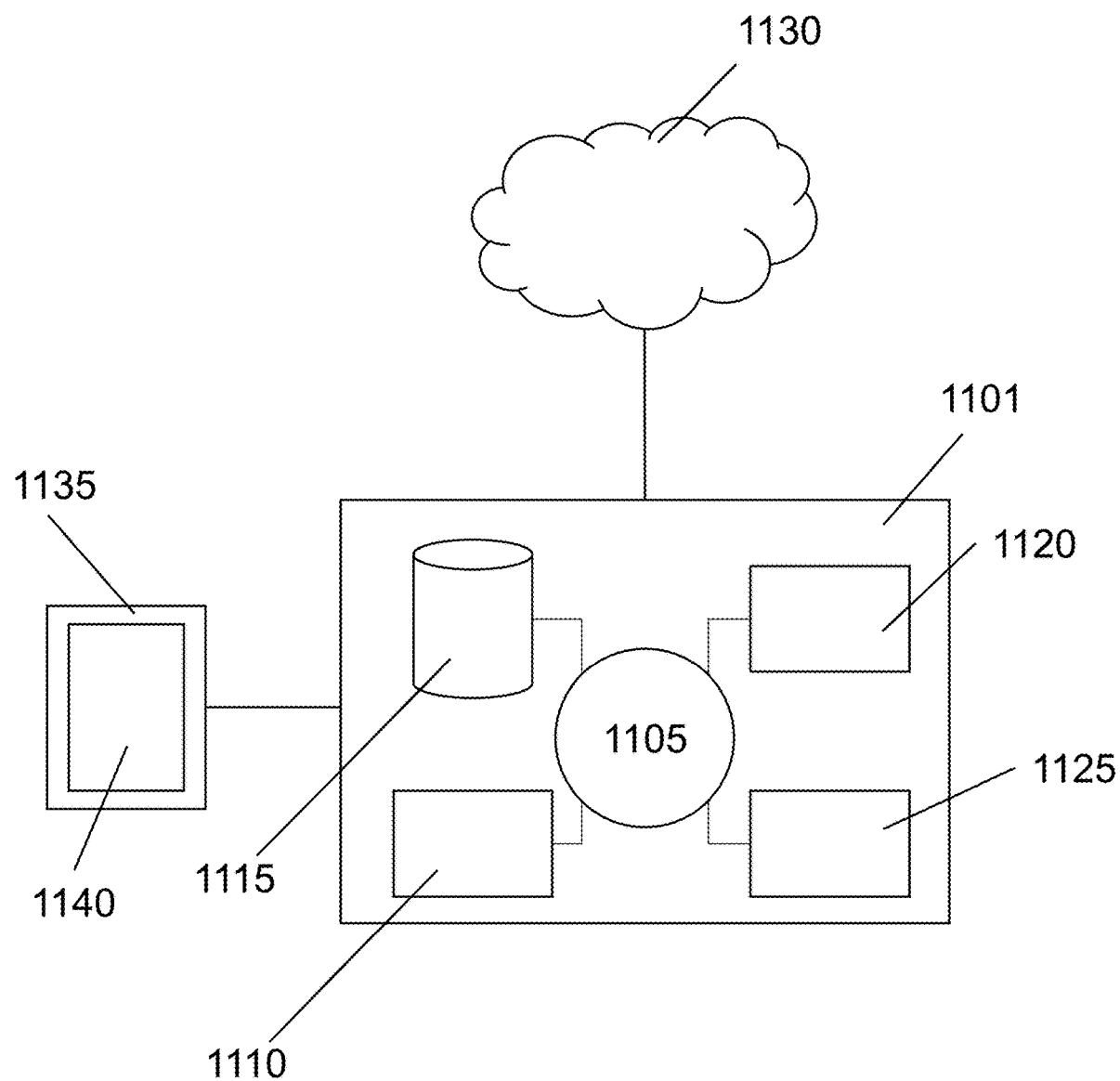
FIG. 11 shows a computer system that is programmed or otherwise configured to implement methods provided herein.

The present disclosure provides computer systems that are programmed to implement methods of the disclosure. FIG. 11 shows a computer system 1101 that is programmed or otherwise configured to perform the methods and systems of the present disclosure. The computer system 1101 can regulate various aspects of the controller, the event signal processor, the electron dose modulator, the driver electronics, the digital pattern generator, the sequence generation algorithm, or combinations thereof, such as, for example, providing instructions to or performing one or more operations of the methods 600, 800, 900, or 1000 disclosed herein or combinations thereof. The computer system 1101 can be an electronic device of a user or a computer system that is remotely located with respect to the electronic device. The electronic device can be a mobile electronic device. The electronic device may be an example of controller 160 as disclosed herein.

In some cases, the components drive electronics 120; digital pattern generator 130, sequence generation algorithm 140, and event signal processor 150 may individually or collectively comprise a controller 160 of the present disclosure. In some cases, the signal from the event signal processor may be conveyed to a controller comprising a driver electronics 120 and a digital pattern generator 130. In some cases, the controller may additionally comprise one or more examples of an event signal processor 150 of the present disclosure. In some cases, the controller may comprise one or more processors. In some cases, digital pattern generator 130, sequence generation algorithm 140, and event signal processor 150 may collectively comprise an electron dose modulator 170 of the present disclosure. In some cases, the controller comprises one or more field programmable gate arrays (FPGAs) or one or more ASICs. In some cases, the first field programable gate array configured to control the deflector. For example, the FPGA or ASIC may comprise digital pattern generator 130, sequence generation algorithm 140, and event signal processor 150. In some cases, drive electronics 120 are substantially analogue and digital pattern generator 130 and sequence generation algorithm 140 are parts of an FPGA or an ASIC. In some cases, event signal processor 150 comprises a second field programable gate array configured to control the detector.

In some cases, digital pattern generator 130, and sequence generation algorithm 140, and event signal processor 150 comprise an FPGA or an ASIC, and drive electronics 120 remains separate. For example, drive electronics 120 may comprise higher voltage switching circuits for the deflectors and may be shielded separately from the lower voltage components.

The present disclosure provides systems comprising a field programmable gate array (FPGA) or an application-specific integrated circuit (ASIC). The FPGA or ASIC comprises programmable logic blocks, programmable interconnects, etc. that are configured to implement any of the methods above or elsewhere herein. The system may comprise one or more computer processors and computer memory coupled thereto. The one or more computer processors may be configured to provide information to the FPGA or ASIC to implement any of the methods above or disclosed herein.

Systems and methods of the present disclose may comprise a scan controller 180. Scan controller 180 may comprise an example of a processor or a computer system, as disclosed herein. In some cases, a scan controller can control and/or direction instructions to one or more components of an electron dose modulator or a controller herein. In some cases, scan controller 180 comprises a computer system, for example, a computer system operable by a user. The scan controller may be configured to control various computing components. For example, the scan controller may send and receive instructions to the FPGAs or ASICs of the present disclosure. An FPGA implementation, as disclosed herein, may or may not have a CPU. In some cases, a CPU disclosed herein is used for communication and configuration, while the FPGA may be responsible for real-time signal processing.

In some examples, the computer system 1101 includes a central processing unit (CPU, also "processor" and "computer processor" herein) 1105, which can be a single core or multi core processor, or a plurality of processors for parallel processing. The computer system 1101 also includes memory or memory location 1110 (e.g., random-access memory, read-only memory, flash memory), electronic storage unit 1115 (e.g., hard disk), communication interface 1120 (e.g., network adapter) for communicating with one or more other systems, and peripheral devices 1125, such as cache, other memory, data storage and/or electronic display adapters. The memory 1110, storage unit 1115, interface 1120 and peripheral devices 1125 are in communication with the CPU 1105 through a communication bus (solid lines), such as a motherboard. The storage unit 1115 can be a data storage unit (or data repository) for storing data. The computer system 1101 can be operatively coupled to a computer network ("network") 1130 with the aid of the communication interface 1120. The network 1130 can be the Internet, an internet and/or extranet, or an intranet and/or extranet that is in communication with the Internet. The network 1130 in some cases is a telecommunication and/or data network. The network 1130 can include one or more computer servers, which can enable distributed computing, such as cloud computing. The network 1130, in some cases with the aid of the computer system 1101, can implement a peer-to-peer network, which may enable devices coupled to the computer system 1101 to behave as a client or a server.

The CPU 1105 can execute a sequence of machine-readable instructions, which can be embodied in a program or software. The instructions may be stored in a memory location, such as the memory 1110. The instructions can be directed to the CPU 1105, which can subsequently program or otherwise configure the CPU 1105 to implement methods of the present disclosure. Examples of operations performed by the CPU 1105 can include fetch, decode, execute, and writeback.

The CPU 1105 can be part of a circuit, such as an integrated circuit. One or more other components of the system 1101 can be included in the circuit. In some cases, the circuit is an application specific integrated circuit (ASIC).

The storage unit 1115 can store files, such as drivers, libraries, and saved programs. The storage unit 1115 can store user data, e.g., user preferences and user programs. The computer system 1101 in some cases can include one or more additional data storage units that are external to the computer system 1101, such as located on a remote server that is in communication with the computer system 1101 through an intranet or the Internet.

The computer system 1101 can communicate with one or more remote computer systems through the network 1130. For instance, the computer system 1101 can communicate with a remote computer system of a user. Examples of remote computer systems include personal computers (e.g., portable PC), slate or tablet PC's (e.g., Apple® iPad, Samsung® Galaxy Tab), telephones, Smart phones (e.g., Apple® iphone, Android-enabled device, Blackberry®), or personal digital assistants. The user can access the computer system 1101 via the network 1130.

Machine Executable Code—Methods as described herein can be implemented by way of machine (e.g., computer processor) executable code stored on an electronic storage location of the computer system 1101, such as, for example, on the memory 1110 or electronic storage unit 1115. The machine executable or machine-readable code can be provided in the form of software. During use, the code can be executed by the processor 1105. In some cases, the code can be retrieved from the storage unit 1115 and stored on the memory 1110 for ready access by the processor 1105. In some situations, the electronic storage unit 1115 can be precluded, and machine-executable instructions are stored on memory 1110.

The code can be pre-compiled and configured for use with a machine having a processer adapted to execute the code or can be compiled during runtime. The code can be supplied in a programming language that can be selected to enable the code to execute in a pre-compiled or as-compiled fashion.

Aspects of the systems and methods provided herein, such as the computer system 1101, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 1101 can include or be in communication with an electronic display 1135 that comprises a user interface (UI) 1140. Examples of UI's include, without limitation, a graphical user interface (GUI) and web-based user interface.

Algorithms—Methods and systems of the present disclosure can be implemented by way of one or more algorithms. An algorithm can be implemented by way of software upon execution by the central processing unit 1105. In some cases, an algorithm can be implemented by way of a field programmable gate array or a plurality of field programmable gate arrays of the present disclosure.

In some cases, the algorithm may comprise a sequence generation algorithm 140. The sequence generation algorithm may be an algorithm which may form an indication of an electron dose waveform of the present disclosure. The sequence generation algorithm may consider one or more parameters. In some cases, the sequence generation algorithm may be an algorithm which may consider one or more of: information about the sample, deflection electronics, detectors involved in the measurement, and the determined waveform input into the control software by the user to form an indication of an electron dose waveform of the present disclosure. The algorithm can, for example, perform one or more of the operations disclosed herein with respect to the sub-section "Algorithmic Thresholding."

For example, a shape of the electron dose waveform may be adjusted according to one or more parameters. It may be advantageous in some cases to continuously adjust the characteristics of the waveform, e.g., a temporal profile of the waveform, according to a property of the image, the deflector, the driver, the detector, or the waveform, in order to improve measurement quality or respond to external changes in the instrument or both. Automatic updating of a temporal profile of a waveform may simplify user experience by correcting for changes in measurement conditions or by automatically inputting improvement measurement settings.

For example, the one or more parameters may comprise information about one or more of a property of an image from the detector, a property of the deflector, a property of the driver electronics, a property of the detector, and the indication of the electron dose waveform. In some cases, the one or more parameters comprise an indication of a minimum, a maximum, or a fixed value for a pulse width or a pulse repetition rate of the electron dose waveform. For example, the waveform may be adjusted such that an indication of waveform by a user may not exceed functional capabilities of the device. In some cases, the indication of the waveform may not exceed fixed parameters of the waveform set by a user, e.g., so that a ramp voltage does not exceed a set level.

In some cases, the one or more parameters comprises a timing constraint of the deflector, the driver electronics, or the pattern generator. For example, a deflector may be timed such that electrons may pass to a detector during a collection interval of a detector. For example, a pattern generator of the deflector may be timed such that electrons pass to a detector during a collection interval. For example, the deflection may be synchronized with a read-out from a detector over a prolonged period of time. A period of time may be, for example, a data acquisition period of up to 8 hours, or more. The timing of the deflector and the detector may be such that the timing accuracy for the two processes meets a defined performance specification, for example, where the synchronization of the two processes is accurate to within 50 msec, or better.

In some cases, the one or more parameters comprise a characteristic timescale of a sample or a process within the sample. For example, the electron dose may cause the sample to deform and move, or to accumulate heat or a net electric charge, each of which may lead to blurry images. In some cases, the structure of the sample may be altered such that the original structure of interest is no longer visible. Each of these processes may have characteristic timescales. For example, effects of the electron dose on the sample may occur at a start of the exposure or may appear for a limited time after the electron beam initially touches the sample. These effects may be reduced or disappear at a later time in the exposure. Accordingly, electron dose waveform may be automatically adjusted, such as by varying the electron dose slowly with time. Varying the dose with time may give the sample an opportunity to adjust as the dose increases or decreases. As another example, effects of the dose may be mitigated by controlling the duration of brief repeated exposures.

In some cases, the one or more parameters comprise a time-dependent voltage bias or temperature. For example, a voltage bias or temperature may be applied to the sample by the sample holder, and this may change the optimal dose waveform. For example, the electron dose may cause the sample to accumulate heat or a net electric charge, each of which may lead to blurry images. For example, a temperature of the sample or instrument may drift, and the waveform may be adjusted to respond. The waveform may adapt to raise or lower average dose to limit induced voltage or current changes or respond to changes in signal or sample based on the heat or charge variation.

In some cases, the one or more parameters comprise a dose rate or a timing consideration of the detector. For example, a deflector may be timed such that electrons may pass to a detector during a collection interval of a detector. For example, the waveform may be synchronized with a read-out from a detector over a prolonged period of time. A period of time may be, for example, a data acquisition period of up to 8 hours, or more. The timing of the waveform and the detector may be such that the timing accuracy for the two processes meets a defined performance specification, for example, where the synchronization of the two processes is accurate to within 50 ms, or better.

In some cases, the one or more parameters comprise an indication of a data signal quality from a collected or a real-time measurement. In some cases, the one or more parameters comprise an indication an effect of the intensity of the electron dose waveform on a sample from a collected or a real-time measurement. In some cases, effects of the dose may reduce a quality of the data. Without being limited by theory, this may be due to, for example, transient charging and/or sample motion. In some case, it may be advantageous to automatically adjust one or more parameters of the electron dose in response to a real-time image.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations, or equivalents. It is intended that the following claims define the scope of the invention and that methods and structures within the scope of these claims and their equivalents be covered thereby.

What is claimed is:

1. A method of forming an image based on an electron event signal, the method comprising:
    (a) providing an information threshold for a sample;
    (b) collecting from an electron detector a number of events equal to the information threshold or determining that an event rate equal to the information threshold is achieved, wherein the electron detector is configured to collect an electron signal or an electron induced signal from the sample; and
    (c) forming an image according to the electron signal or the electron induced signal.

2. The method of claim 1, wherein the electron signal or the electron induced signal is a single electron signal.

3. The method of claim 1, wherein the information threshold is a number of events at a single pixel.

4. The method of claim 1, wherein the information threshold is an average or sum of events over a plurality of pixels.

5. The method of claim 1, wherein the information threshold is an average or sum of events across a plurality of detectors or detector segments.

6. The method of claim 3, wherein an event of the average or sum of events is an electron impact.

7. The method of claim 3, wherein an event of the average or sum is a single count on the electron detector.

8. The method of claim 7, wherein the single count is a determined use of an event signal processor.

9. The method of claim 1, wherein the information threshold is set by a user, and wherein the information threshold is configured to be varied by a user.

10. The method of claim 1, wherein the information threshold is a damage threshold for the sample.

11. The method of claim 1, wherein the information threshold is determined by an information gain for a pixel being less than a threshold.

12. The method of claim 1, wherein the information threshold is determined by information about the sample.

13. The method of claim 1, wherein the information threshold is determined by experiment.

14. The method of claim 1, wherein the information threshold is set with input from a model of information efficiency.

15. The method of claim 1, wherein the electron induced signal comprises a measurement from an energy dispersive X-ray spectrometer (EDS).

16. The method of claim 1, wherein (c) comprises forming the image according to a time to achieve the threshold number of events.

17. The method of claim 1, wherein (c) comprises forming the image according to a threshold event rate for a plurality of pixels.

18. The method of claim 1, wherein (c) comprises forming the image in real time.

19. The method of claim 1, wherein (c) comprises building up the image pixel-by-pixel.

20. The method of claim 1, wherein the method further comprises displaying the image in arbitrary units.

21. The method of claim 1, wherein the method is implemented by an electron imaging system.

* * * * *